(12) United States Patent
Lee

(10) Patent No.: US 12,477,736 B2
(45) Date of Patent: Nov. 18, 2025

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Ki Hong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/601,068

(22) Filed: Mar. 11, 2024

(65) Prior Publication Data

US 2024/0215247 A1 Jun. 27, 2024

Related U.S. Application Data

(62) Division of application No. 17/372,128, filed on Jul. 9, 2021, now Pat. No. 11,956,960.

(30) Foreign Application Priority Data

Jan. 21, 2021 (KR) .................... 10-2021-0008768

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 43/10; H10B 41/27; H10B 41/10; H10B 41/35
See application file for complete search history.

(56) References Cited

U.S. PATENT DOCUMENTS

| | | | |
|---|---|---|---|
| 9,859,420 B1* | 1/2018 | Balakrishnan | H10D 48/383 |
| 10,756,110 B1 | 8/2020 | Sharangpani et al. | |
| 11,792,994 B2 | 10/2023 | Kanamori et al. | |
| 2012/0299117 A1* | 11/2012 | Lee | H10D 30/693 |
| | | | 257/E27.06 |
| 2019/0027489 A1* | 1/2019 | Orimoto | H01L 23/5283 |
| 2019/0074291 A1 | 3/2019 | Lu et al. | |
| 2019/0122935 A1* | 4/2019 | Cheng | H10D 84/013 |

(Continued)

FOREIGN PATENT DOCUMENTS

| | | |
|---|---|---|
| KR | 101182942 B1 | 9/2012 |
| KR | 1020190006758 A | 1/2019 |

*Primary Examiner* — Matthew C Landau
*Assistant Examiner* — Halee Cramer
(74) *Attorney, Agent, or Firm* — WILLIAM PARK AND ASSOCIATES LTD.

(57) ABSTRACT

A semiconductor device includes a gate stack with conductive layers and insulating layers that are stacked alternately with each other, a first channel pattern passing through the gate stack, a second channel pattern coupled to the first channel pattern, the second channel pattern protruding above a top surface of the gate stack, an insulating core formed in the first channel pattern, the insulating core extending into the second channel pattern, a gate liner with a first portion that surrounds a top surface of the gate stack and a second portion that surrounds a portion of a sidewall of the second channel pattern, and a barrier pattern coupled to the gate liner, the barrier pattern surrounding a remaining portion of the sidewall of the second channel pattern.

9 Claims, 34 Drawing Sheets

(56) References Cited

U.S. PATENT DOCUMENTS

| | | |
|---|---|---|
| 2020/0051995 A1 | 2/2020 | Tanaka et al. |
| 2020/0098780 A1* | 3/2020 | Cui ........................ H10B 43/10 |
| 2020/0279858 A1* | 9/2020 | Xie ...................... H10D 30/694 |
| 2021/0091093 A1 | 3/2021 | Kanamori et al. |
| 2021/0143160 A1* | 5/2021 | Ryu ....................... H10B 43/27 |

* cited by examiner

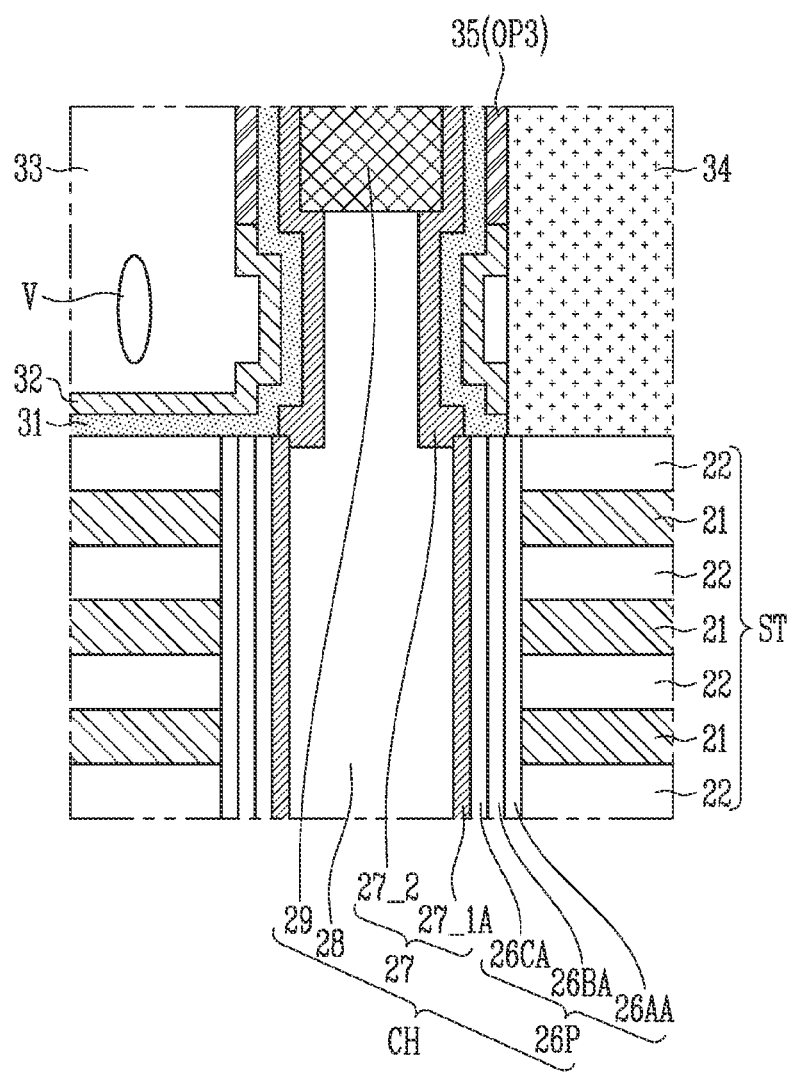

B-B'

C-C'

B-B'

B-B'

C-C'

B-B'

C-C'

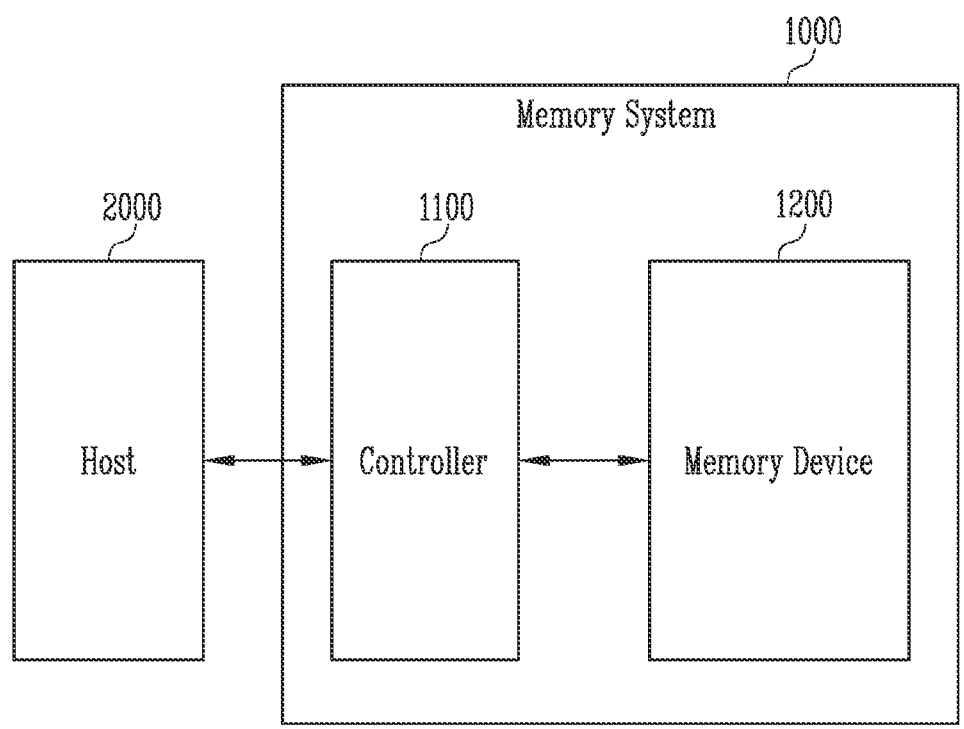

SEMICONDUCTOR DEVICE AND MANUFACTURING METHOD OF SEMICONDUCTOR DEVICE

CROSS-REFERENCE TO RELATED APPLICATION

The present application is a divisional application of U.S. patent application Ser. No. 17/372,128, filed on Jul. 9, 2021, and claims priority under 35 U.S.C. § 119(a) to Korean patent application number 10-2021-0008768 filed on Jan. 21, 2021, in the Korean Intellectual Property Office, the entire disclosure of which are incorporated by reference herein.

BACKGROUND

1. Technical Field

Various embodiments of the invention relate generally to an electronic device, and more particularly, to a semiconductor device and a method of manufacturing the semiconductor device.

2. Related Art

The degree of integration density of a semiconductor device may be determined mainly by an area of a unit memory cell. Recently, however, the increase in integration density of a semiconductor device in which memory cells are formed in a single layer over a substrate has been limited. Thus, three-dimensional semiconductor devices have been proposed in which memory cells are stacked over a substrate. In addition, to improve the operational reliability of these three-dimensional semiconductor devices, various structures and manufacturing methods have been developed.

SUMMARY

According to an embodiment, a semiconductor device may include a gate stack with conductive layers and insulating layers that are stacked alternately with each other, channel layers passing through the gate stack, the channel layers protruding past a top surface of the gate stack, a gate liner with a first portion that surrounds the top surface of the gate stack and second portions that protrude from the first portion and surround the respective channel layers, an isolation insulating layer formed on the gate stack and passing through the first portion of the gate liner, wherein at least one second portion among the second portions protrudes farther into the isolation insulating layer than the first portion.

According to an embodiment, a semiconductor device may include a gate stack with conductive layers and insulating layers that are stacked alternately with each other, a first channel pattern passing through the gate stack, a second channel pattern coupled to the first channel pattern, the second channel pattern protruding above a top surface of the gate stack, an insulating core formed in the first channel pattern, the insulating core extending into the second channel pattern, a gate liner with a first portion that surrounds a top surface of the gate stack and a second portion that surrounds a portion of a sidewall of the second channel pattern, and a barrier pattern coupled to the gate liner, the barrier pattern surrounding a remaining portion of the sidewall of the second channel pattern.

According to an embodiment, a method of manufacturing a semiconductor device may include forming a stacked structure with first material layers and second material layers that are stacked alternately with each other, forming a preliminary channel structure with a first channel pattern that passes through the stacked structure and an insulating core with a first portion that is located in the first channel pattern and a second portion that is coupled to the first portion, the second portion protruding above a top surface of the stacked structure, forming a channel structure that surrounds the insulating core, the channel structure including a second channel pattern coupled to the first channel pattern, forming a gate liner with a first portion that surrounds the top surface of the stacked structure and a second portion surrounding the second channel pattern, forming a gap-filling insulating layer on the gate liner, and an isolation insulating layer that passes through the gap-filling insulating layer and the first portion of the gate liner.

BRIEF DESCRIPTION OF THE DRAWINGS

FIG. 9 is a diagram illustrating a memory system according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

In the description of the following embodiments, the terms "preset" and "predetermined" mean that the numerical value of a parameter is determined in advance when the parameter is used in a process or algorithm. Depending on the embodiment, the numerical value of a parameter may be set when a process or algorithm starts or may be set during a period in which the process or algorithm is executed.

Terms such as "first" and "second" used to distinguish various components do not limit the components. For example, a first component may be named a second component, and conversely, the second component may be named the first component.

When it is described that one component is "coupled" or "connected" to another component, it is to be understood that the one component may be coupled or connected to the another component directly or by the medium of still another component. On the other hand, the descriptions of "directly coupled" or "directly connected" should be understood to mean that one component is coupled or connected to another component directly without intervention of a still another component.

Various embodiments are directed to a semiconductor device with a stabilized structure and improved characteristics, and a method of manufacturing the semiconductor device.

Figure 1A:
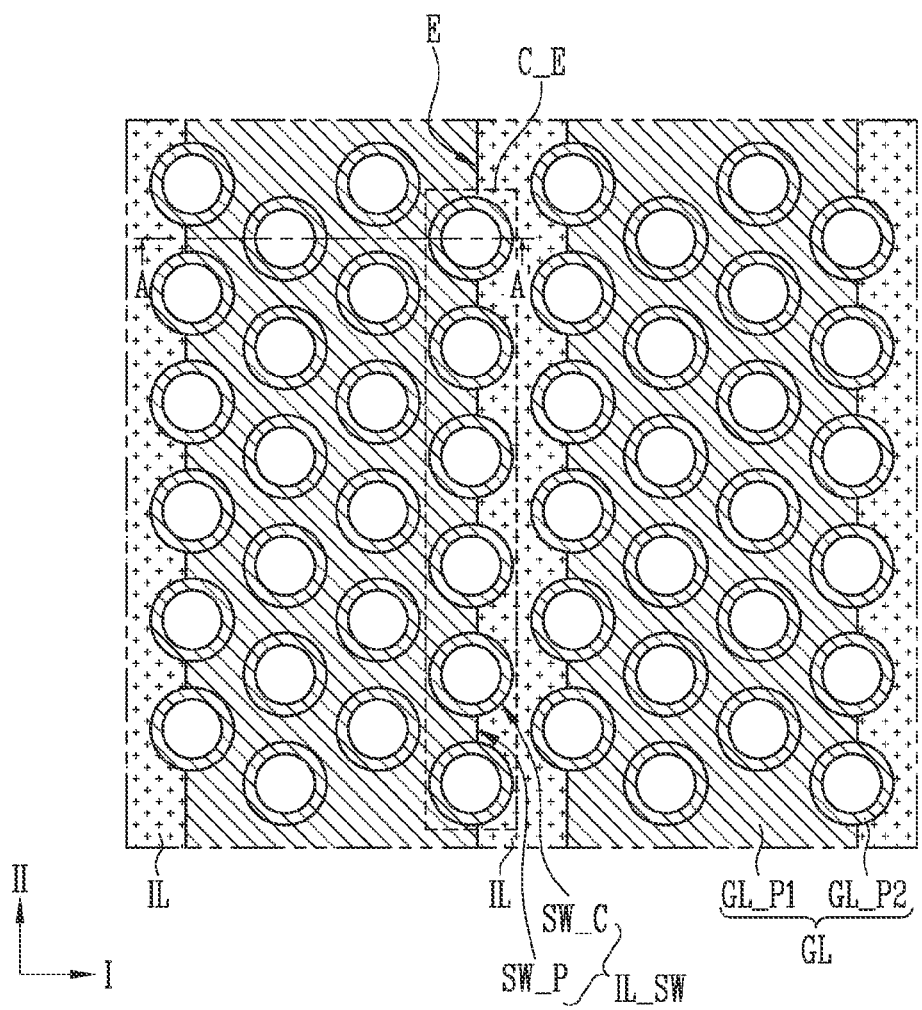
FIGS. 1A to 1E are diagrams illustrating the structure of a semiconductor device according to an embodiment of the present disclosure.
Figure 1B:
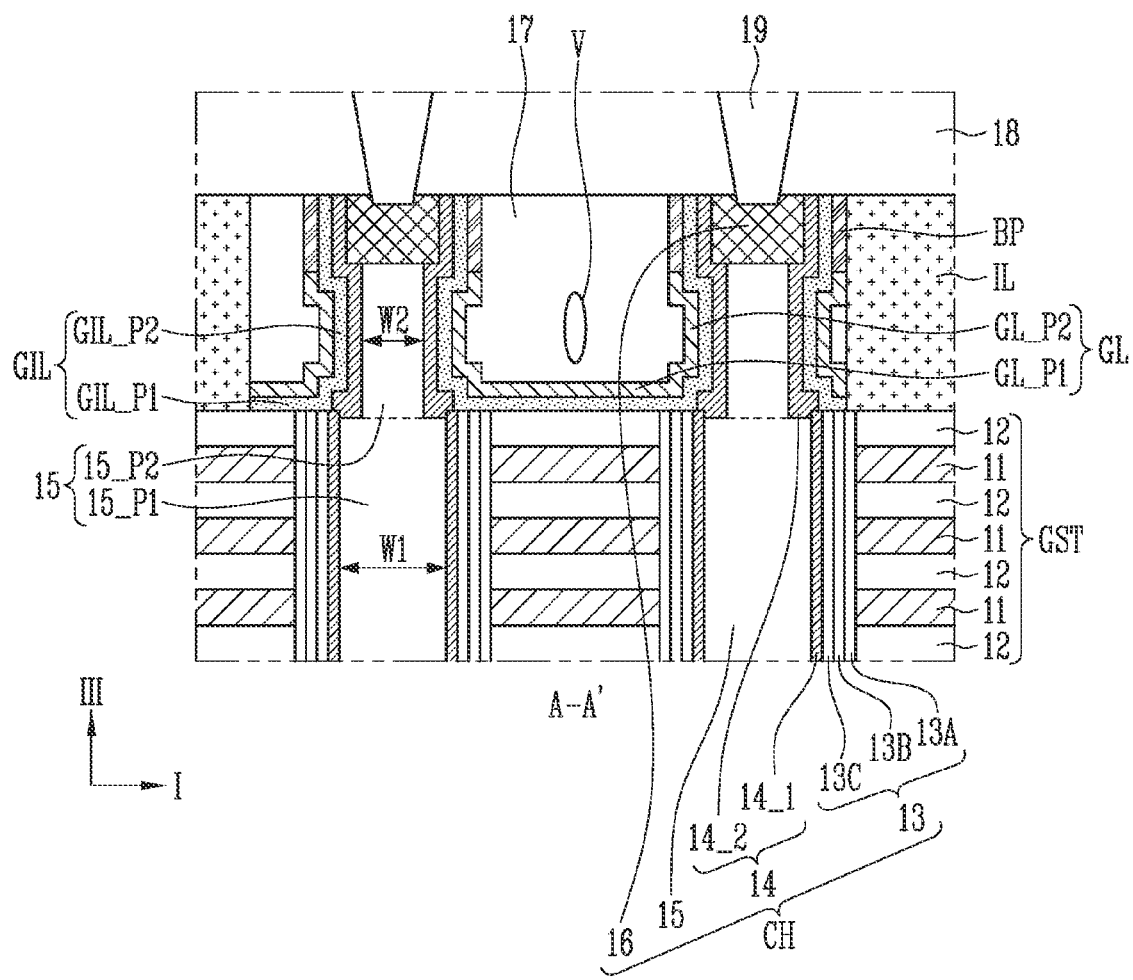
Figure 1C:
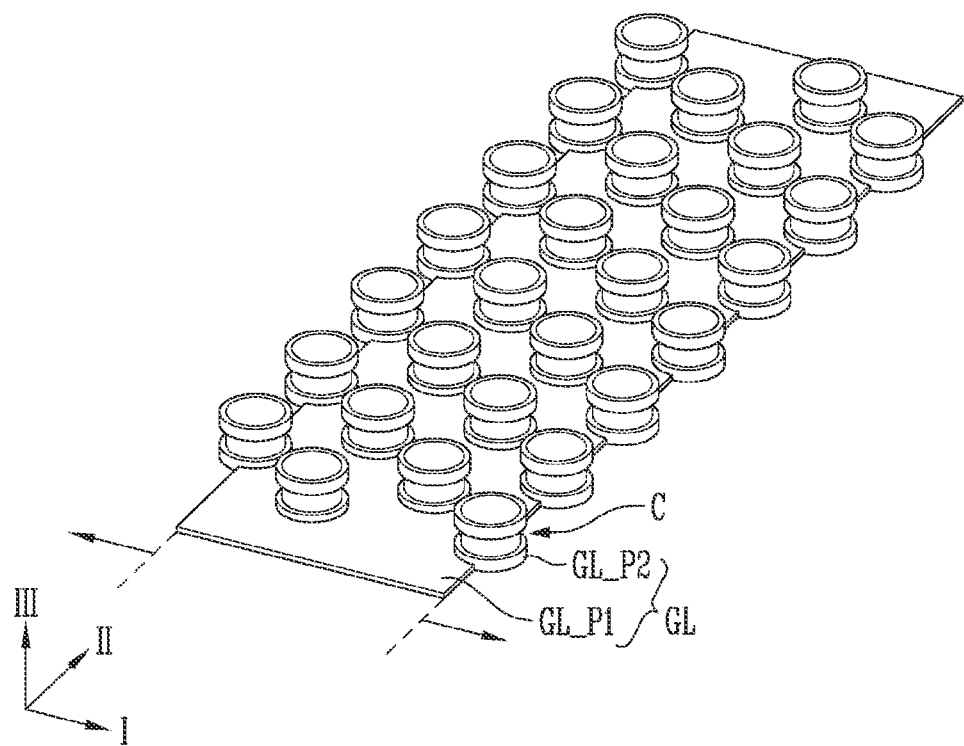
Figure 1D:
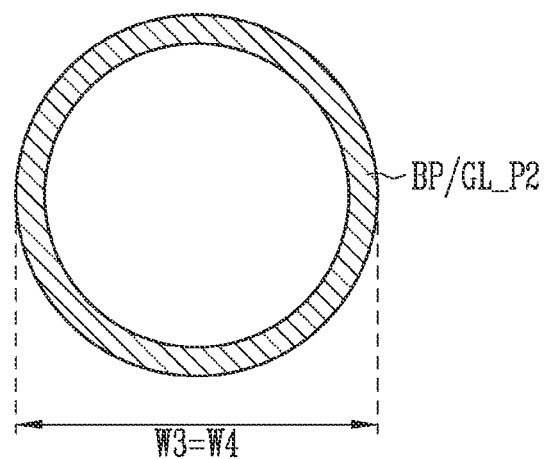
Figure 1E:
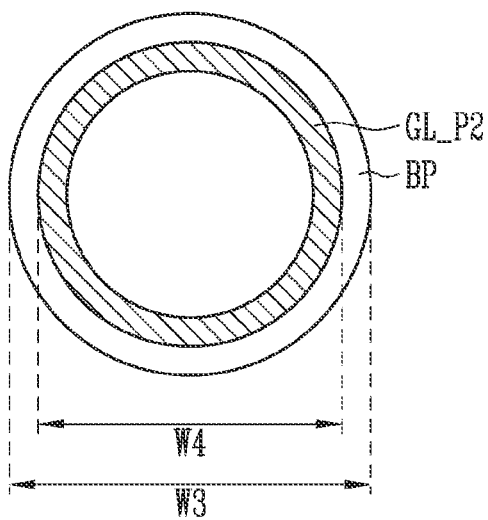

FIGS. 1A to 1E are diagrams illustrating the structure of a semiconductor device according to an embodiment of the present disclosure. FIG. 1A may be a layout view and FIG. 1B may be an A-A' cross-sectional view of FIG. 1A. FIG. 1C may be a perspective view illustrating the structure of a gate liner. FIGS. 1D and 1E may be layout views illustrating a barrier pattern and a gate liner.

Referring to FIGS. 1A to 1E, a semiconductor device may include a gate stack GST, channel structures CH, a gate liner GL, and an isolation insulating layer IL. The semiconductor device may further include a barrier pattern BP, a gate insulating liner GIL, a gap-filling insulating layer 17, an interlayer insulating layer 18, contact plugs 19, or a combination thereof.

The gate stack GST may include conductive layers 11 and insulating layers 12 that are stacked alternately with each other. Each of the conductive layers 11 may be a gate electrode of a memory cell or a select transistor. According to an embodiment, at least one lowermost conductive layer 11, among the conductive layers 11, may be a source select line, and the other conductive layers 11 may be word lines. The conductive layers 11 may include a conductive material, such as polysilicon, tungsten, molybdenum, or metal. The insulating layers 12 may be provided to insulate the stacked conductive layers 11 from each other. The insulating layers 12 may include an insulating material, such as an oxide, a nitride, or an air gap.

The channel structures CH may penetrate the gate stack GST. In a plan view, referring to FIG. 1A, the channel structures CH may be arranged in a first direction I and in a second direction II that crosses the first direction I. The channel structures CH may extend in a third direction III. The third direction III may protrude from the plane that is defined by the first direction I and the second direction II. According to an embodiment, the third direction III may be the direction in which the conductive layers 11 and the insulating layers 12 are stacked alternately with each other.

Each of the channel structures CH may include a channel layer 14. The channel layer 14 may pass through the gate stack GST and protrude above a top surface of the gate stack GST. The channel layer 14 may include a semiconductor material, such as silicon or germanium, or a nanostructure.

The channel layer 14 may include a first channel pattern 14_1 and a second channel pattern 14_2 that is coupled to the first channel pattern 14_1. The first channel pattern 14_1 may penetrate through the gate stack GST. The second channel pattern 14_2 may protrude above the top surface of the gate stack GST. The sidewall of the second channel pattern 14_2 may be uneven. The first channel pattern 14_1 and the second channel pattern 14_2 may directly contact each other. An interface may exist between the first channel pattern 14_1 and the second channel pattern 14_2.

Each of the channel structures CH may further include a memory layer 13. The memory layer 13 may be interposed between the channel layer 14 and the conductive layers 11. According to an embodiment, the memory layer 13 may surround a sidewall of the first channel pattern 14_1 and may be interposed between the first channel pattern 14_1 and the gate stack GST. The memory layer 13 may include a tunneling layer 13C, a data storage layer 13B, a blocking layer 13A, or a combination thereof. The data storage layer 13B may include a floating gate, a charge trapping material, polysilicon, a nitride, a variable resistance material, a phase change material, or a combination thereof.

Each of the channel structures CH may further include a channel pad 16. The channel pad 16 may be provided to couple the channel layer 14 to the contact plug 19. Each of the channel pads 16 may be directly coupled to each of the channel layers 14, respectively. The channel pad 16 may include a conductive material, such as polysilicon or metal.

Each of the channel structures CH may further include an insulating core 15. The insulating core 15 may be formed in the channel layer 14. The insulating core 15 may include an insulating material, such as an oxide, a nitride, or an air gap. The insulating core 15 may include a first portion 15_P1 around which the first channel pattern 14_1 is formed and a second portion 15_P2 around which the second channel pattern 14_2 is formed. An interface might not exist between the first portion 15_P1 and the second portion 15_P2.

The insulating core 15 may have a uniform width or a variable width. The first portion 15_P1 may have a first width W1, and the second portion 15_P2 may have a second width W2. The second width W2 may be less than the first width W1. The unevenness of the second channel pattern 14_2 may be defined by the shape of the insulating core 15. More specifically, the difference in the width between the first portion 15_P1 and the second portion 15_P2 may cause the unevenness of the second channel pattern 14_2.

The gate liner GL may be disposed over the gate stack GST. The gate liners GL may be located on the gate stack GST and may be separated from each other in the first direction I. The gate liner GL may be a gate electrode of a select transistor. According to an embodiment, the gate liner GL may be a source select line. The gate liners GL may include a conductive material, such as polysilicon, tungsten, molybdenum, or metal. According to an embodiment, each of the gate liners GL may include a barrier layer and a metal layer. The barrier layer may include a metal nitride, a metal oxide, or a combination thereof.

Each of the gate liners GL may include at least one first portion GL_P1 and one or more second portions GL_P2. Hereinafter, an embodiment in which the gate liner GL includes the first portion GL_P1 and the second portions GL_P2 will be described below. The first portion GL_P1 may surround the top surface of the gate stack GST. The first portion GL_P1 may include a width in the first direction I and an edge E that extends in the second direction II. The first portion GL_P1 may extend in the second direction II.

The second portions GL_P2 may be coupled to the first portion GL_P1 and may protrude from the first portion GL_P1 in the third direction III. Each of the second portions GL_P2 may surround each of the channel layers 14. The second portion GL_P2 may surround the sidewall of the second channel pattern 14_2. The second portion GL_P2 may surround a portion or the entirety of the sidewall of the second channel pattern 14_2. The sidewall of the second portion GL_P2 may be uneven. The unevenness may be defined by the shape of the insulating core 15. According to an embodiment, the sidewall of the second portion GL_P2 may include a recessed portion C.

At least one of the second portions GL_P2 may protrude farther than the first portion GL_P1 in the first direction I. According to an embodiment, the second portions GL_P2 that are arranged in the second direction II may form a single column. An edge column C_E, among a plurality of columns that are included in one gate liner GL, may be located to overlap the edge E of the first portion GL_P1. In the plane that is defined in the first direction I and the second direction II, the edge column C_E may protrude farther than the edge E in the first direction I.

The barrier pattern BP may be coupled to the gate liner GL. The barrier pattern BP may surround a sidewall of the channel layer 14. In an embodiment, the second portion GL_P2 of the gate liner GL may surround a portion of the sidewall of the second channel pattern 14_2. The barrier pattern BP may surround a remaining portion of the sidewall of the second channel pattern 14_2. The barrier pattern BP may be a residue of an etch stop layer that is used during a manufacturing process. The barrier pattern BP may include a material with an etch selectivity with respect to the interlayer insulating layer 18. According to an embodiment, the interlayer insulating layer 18 may include an oxide, and the barrier pattern BP may include a nitride.

The width of the barrier pattern BP may be the same as or different than the width of the second portion GL_P2 of the gate liner GL. Referring to FIG. 1D, the width W3 of the barrier pattern BP may be substantially the same as the width W4 of the second portion GL_P2 of the gate liner GL. Referring to FIG. 1E, the width W3 of the barrier pattern BP may be greater than the width W4 of the second portion GL_P2. According to an embodiment, when the sidewall of the second portion GL_P2 includes the recessed portion C, the width W3 of the barrier pattern BP may be greater than the minimum width W4 of the second portion GL_P2.

The gate insulating liner GIL may be interposed between the gate liner GL and the channel layers 14 and may be interposed between the gate liner GL and the gate stack GST. The gate insulating liner GIL may extend between the channel layer 14 and the barrier pattern BP. The gate insulating liner GIL may have a shape that corresponds to the gate liner GL or a shape that corresponds to the gate liner GL and the barrier pattern BP.

The gate insulating liner GIL may include a first portion GIL_P1 and second portions GIL_P2. The first portion GIL_P1 may surround the top surface of the gate stack GST. Each of the second portions GIL_P2 may surround the sidewall of each of the channel layers 14, respectively. The second portion GIL_P2 may surround the sidewall of the second channel pattern 14_2. The sidewall of the second portion GIL_P2 may be uneven. The unevenness may be defined by the shape of the insulating core 15.

The gap-filling insulating layer 17 may be located on the first portion GL_P1 of the gate liner GL. The gap-filling insulating layer 17 may fill the space between the second portions GL_P2 of the gate liner GL. The gap-filling insulating layer 17 may fill the recessed portion C of the gate liner GL. The gap-filling insulating layer 17 may include a void V. The void V may refer to an empty space that is not filled with an insulating material and may be filled with air. The void V may be located at a position that corresponds to the recessed portion C of the gate liner GL. The gap-filling insulating layer 17 may include an insulating material, such as an oxide or a nitride.

The isolation insulating layer IL may be located on the gate stack GST. The isolation insulating layer IL may pass through the first portion GL_P1 of the gate liner GL and the first portion GIL_P1 of the gate insulating liner GIL. The isolation insulating layer IL may be located between the gate liners GL and between the gate insulating liners GIL to separate the gate liners GL from each other and separate the gate insulating liners GIL from each other. At least one of the second portions GL_P2 of the gate liner GL may protrude farther into the isolation insulating layer IL than the first portion GL_P1. The isolation insulating layer IL may include an insulating material, such as an oxide or a nitride.

The isolation insulating layer IL may have a width in the first direction I and a sidewall IL_SW that extends in the second direction II. The isolation insulating layer IL may extend in the second direction II. At least one of the second portions GL_P2 may be located adjacent to the isolation insulating layer IL, the isolation insulating layer IL surrounding a portion of the at least one of the second portions GL_P2.

The sidewall IL_SW of the isolation insulating layer IL may be uneven. The unevenness of the isolation insulating layer IL may reflect the shape of the sidewalls of the gate liner GL. The edge E of the first portion GL_P1 and the sidewalls of the second portions GL_P2 that protrude farther than the edge E may cause the unevenness of the sidewall IL_SW of the isolation insulating layer IL.

According to an embodiment, the sidewall IL_SW of the isolation insulating layer IL may include recessed portions SW_C and protruding portions SW_P. The recessed portions SW_C may correspond to the second portions GL_P2 of the gate liner GL. The recessed portions SW_C may surround sidewalls of the second portions GL_P2. The protruding portions SW_P may correspond to the first portion GL_P1 of the gate liner GL. The protruding portions SW_P may protrude between the second portions GL_P2 and contact the first portion GL_P1.

According to the above-described structure, memory cells may be located at intersections between the channel structure CH and the conductive layers 11. Select transistors may be located at intersections between the channel structure CH and the gate liner GL. Select transistors that are located at both sides of the isolation insulating layer IL may be configured such that the sidewalls of the second channel patterns 14_2 are surrounded by the gate liner GL. In a plane that is defined in the first and second directions I and II, the entire sidewalls of the second channel pattern 14_2 may be surrounded by the gate liner GL. Therefore, the select transistors that are located at both sides of the isolation insulating layer IL may serve as real select transistors, not dummy select transistors, and may have uniform characteristics.

Figure 2A:
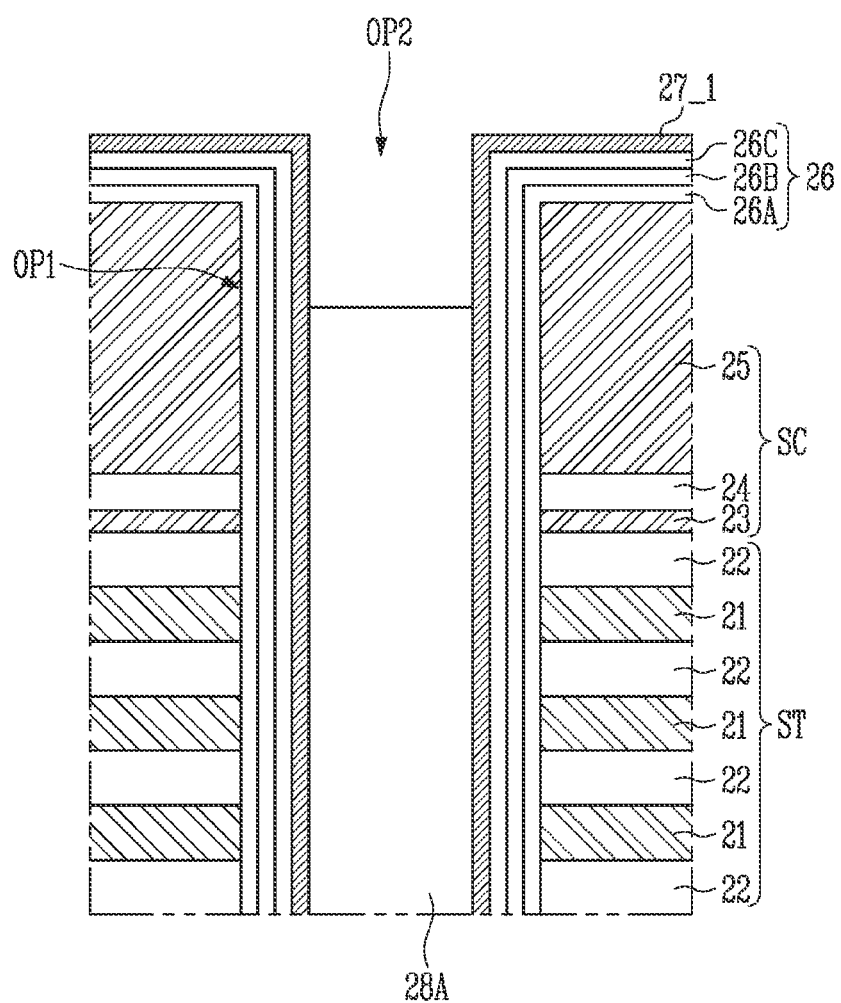
FIGS. 2A to 2N are diagrams illustrating the structure of a semiconductor device according to an embodiment of the present disclosure.
Figure 2B:
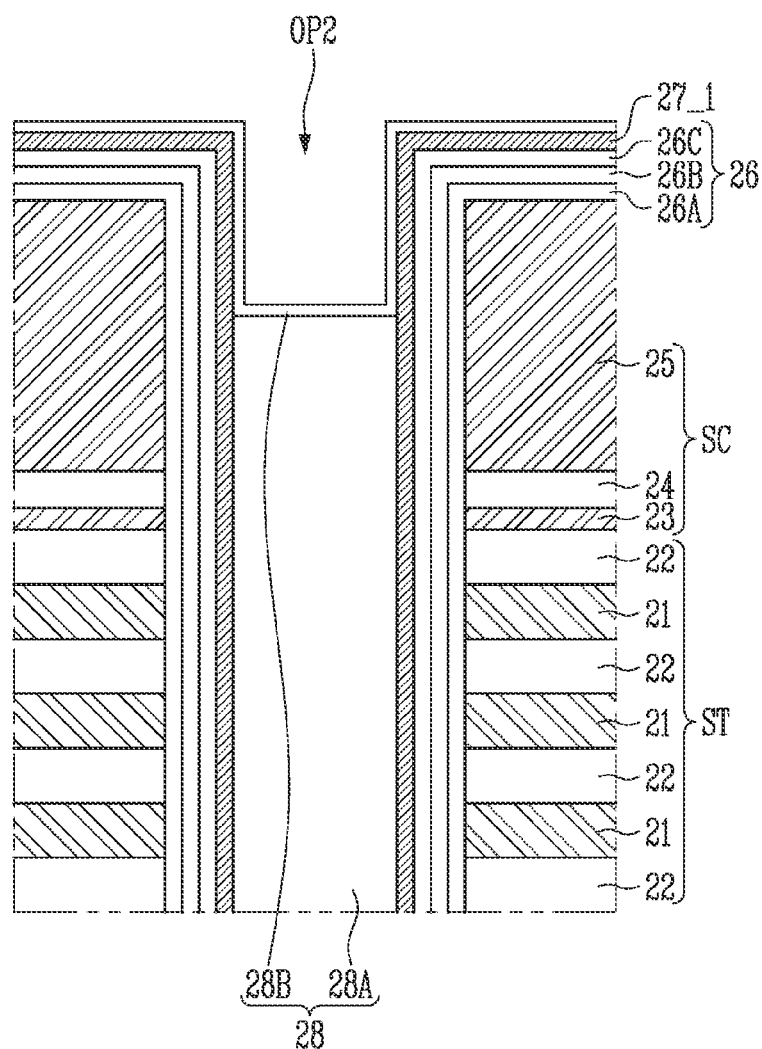
Figure 2C:
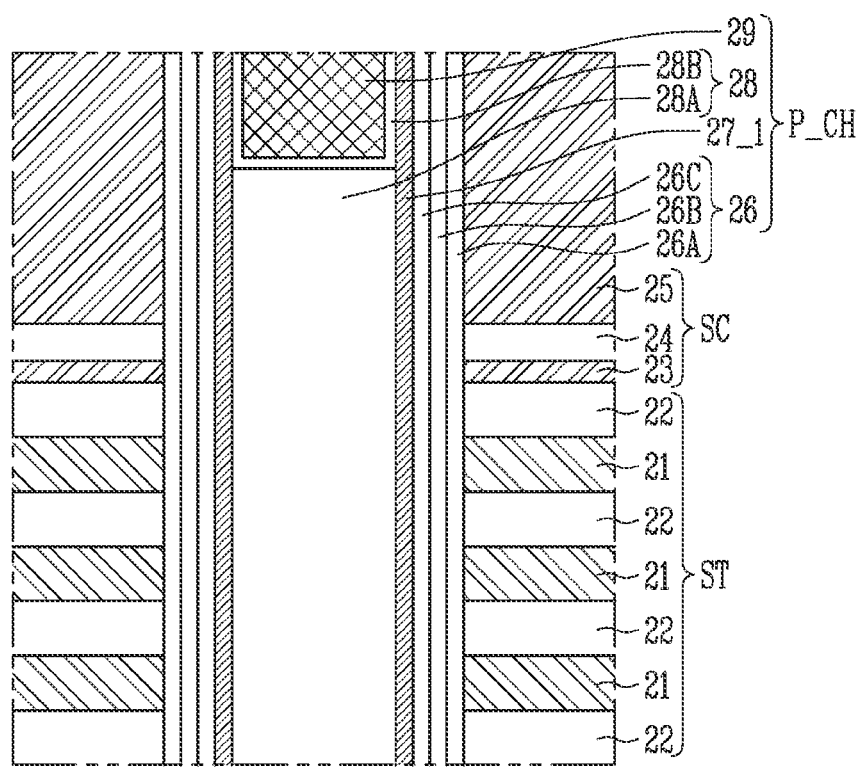
Figure 2D:
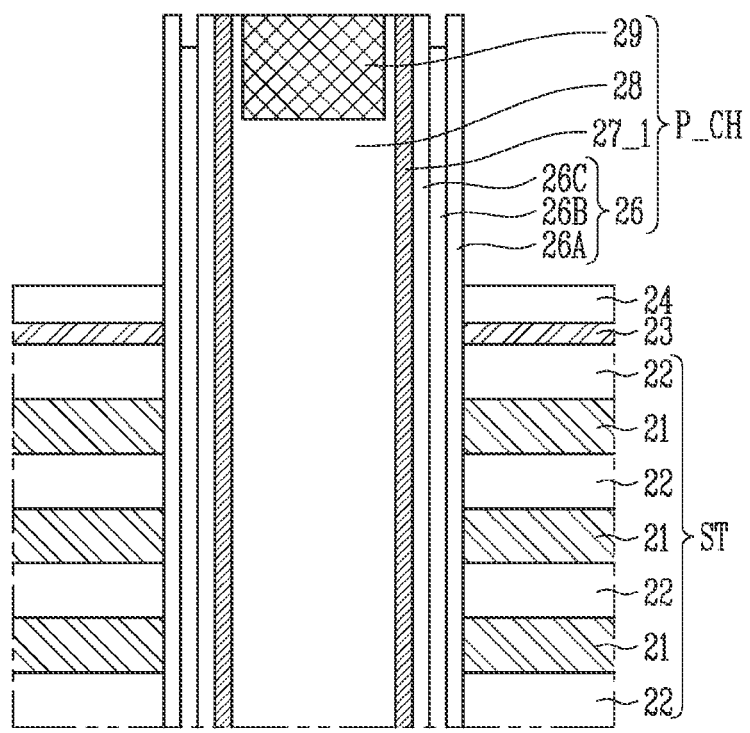
Figure 2E:
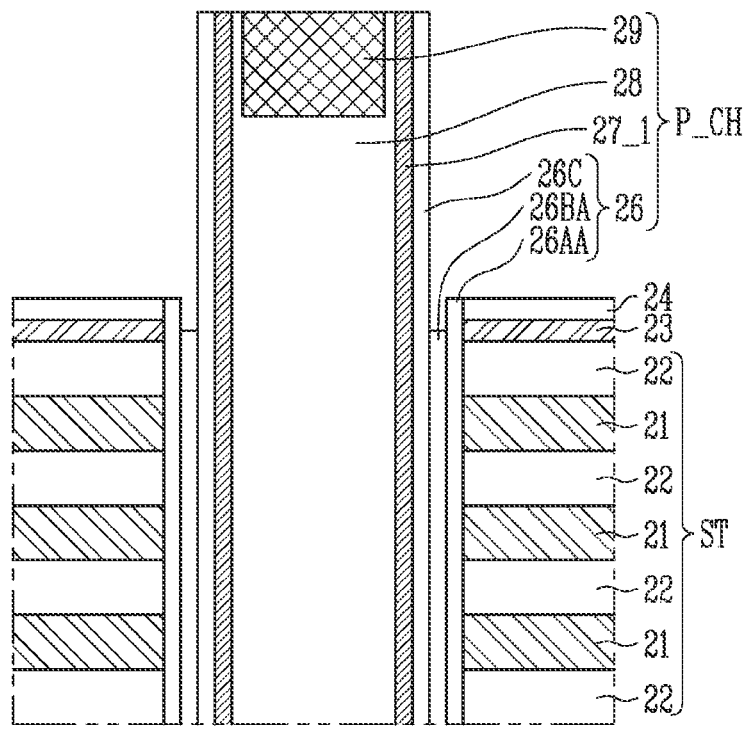
Figure 2F:
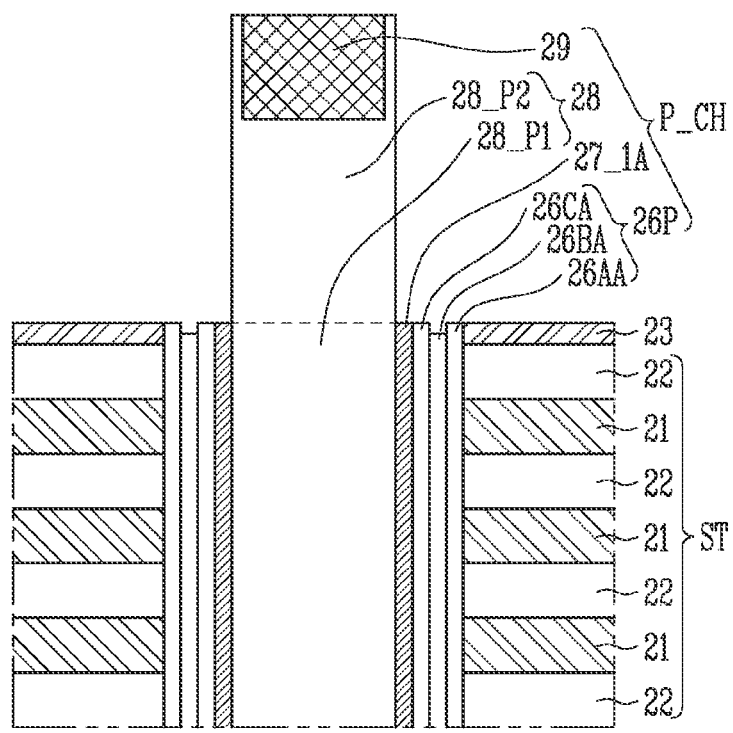
Figure 2G:
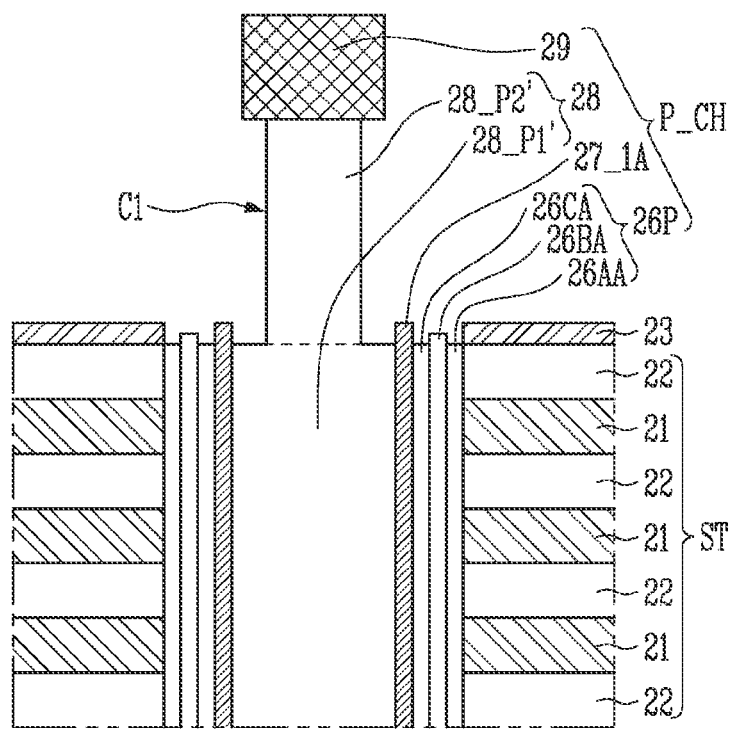
Figure 2H:
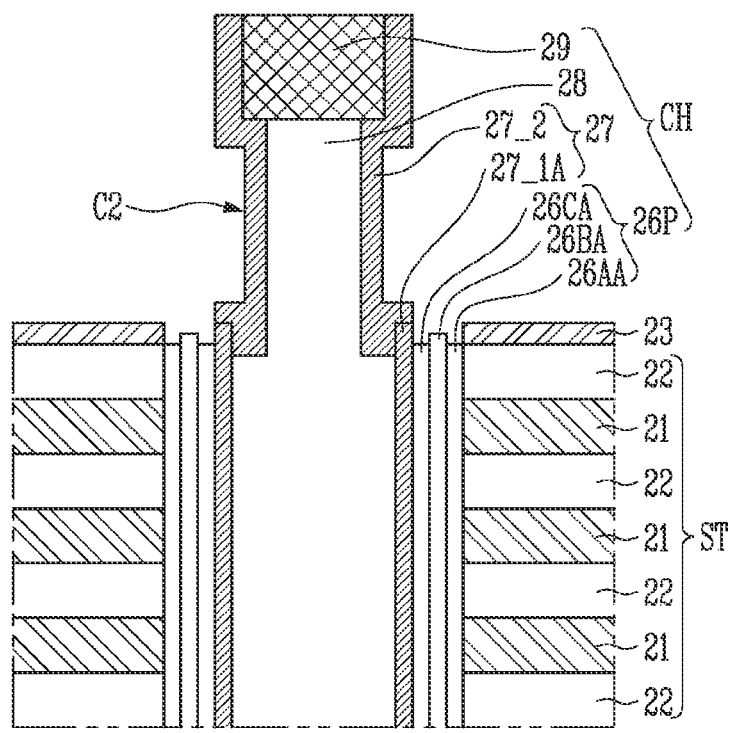
Figure 2I:
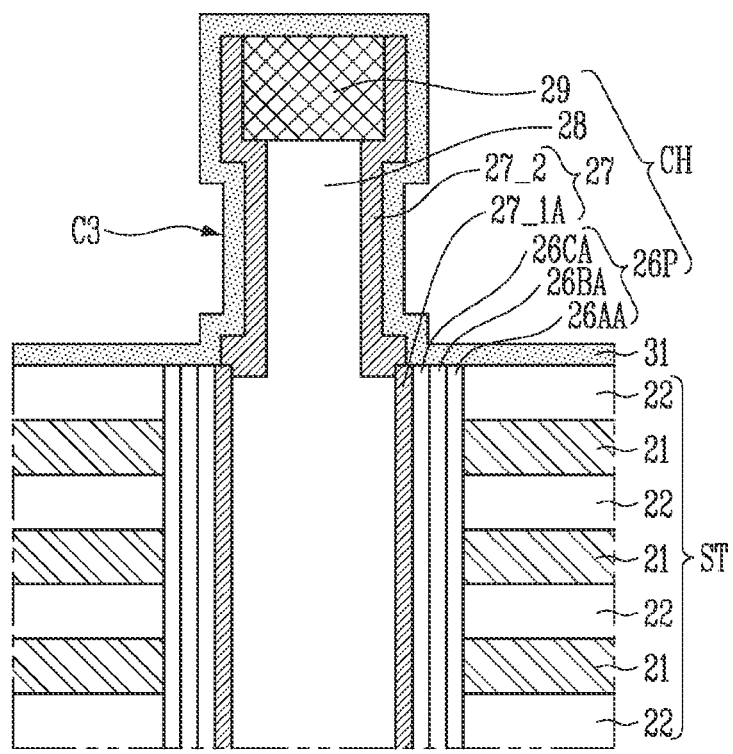
Figure 2J:
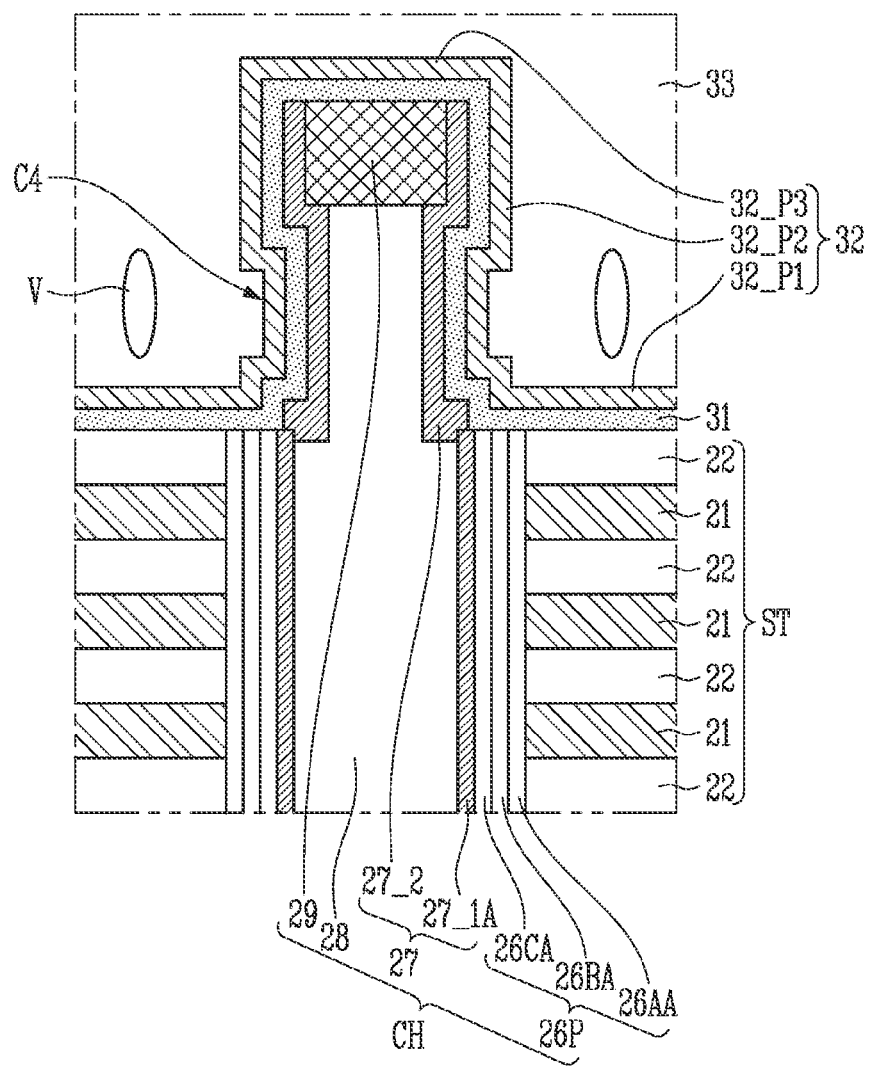
Figure 2K:
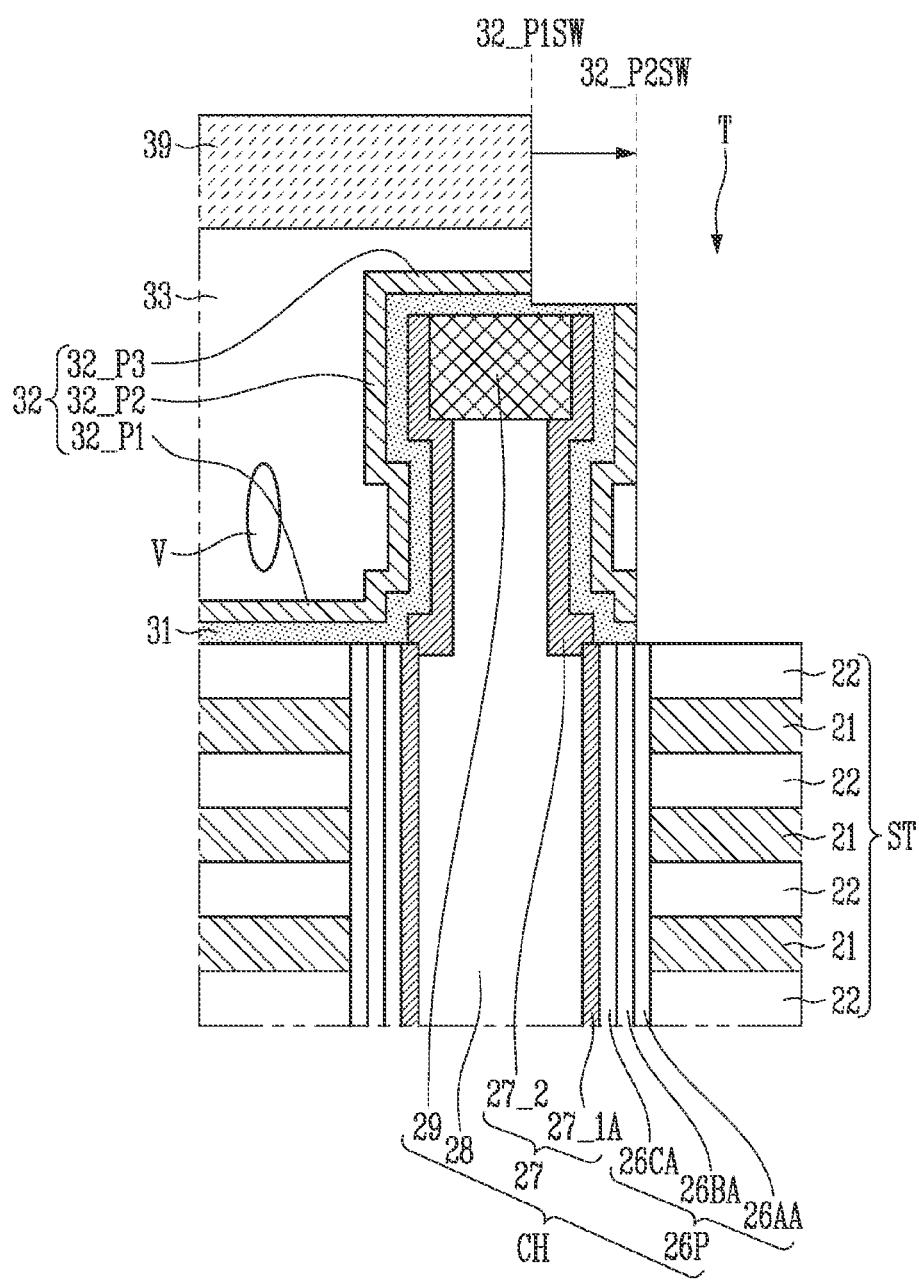
Figure 2L:
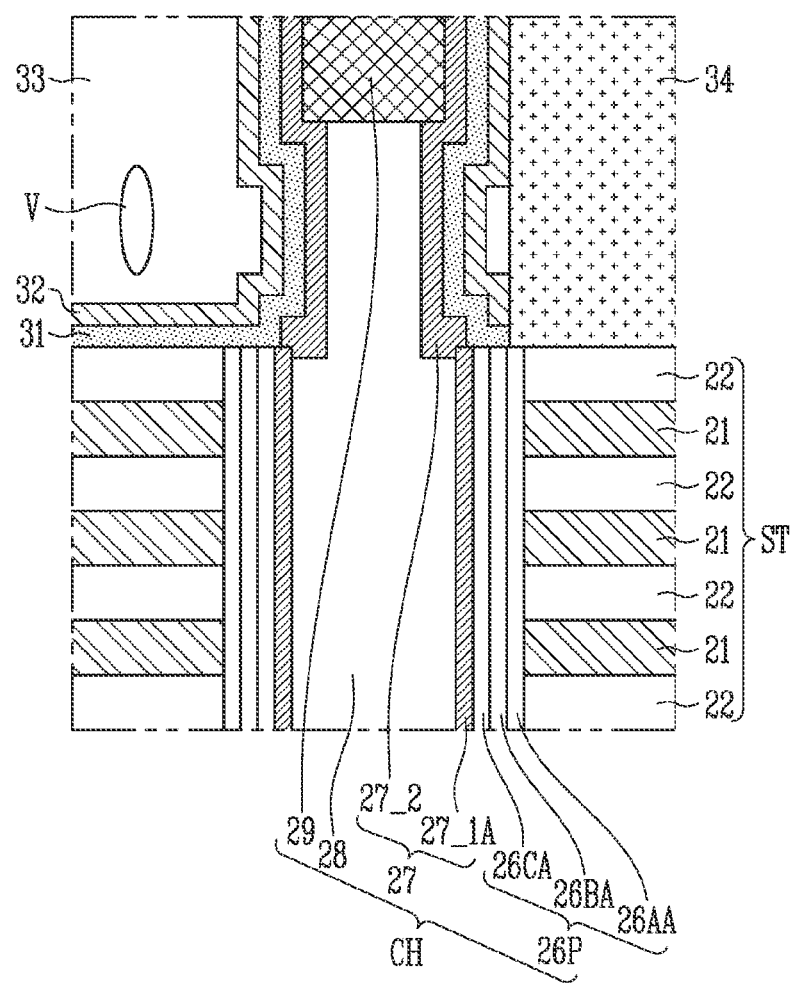
Figure 2N:
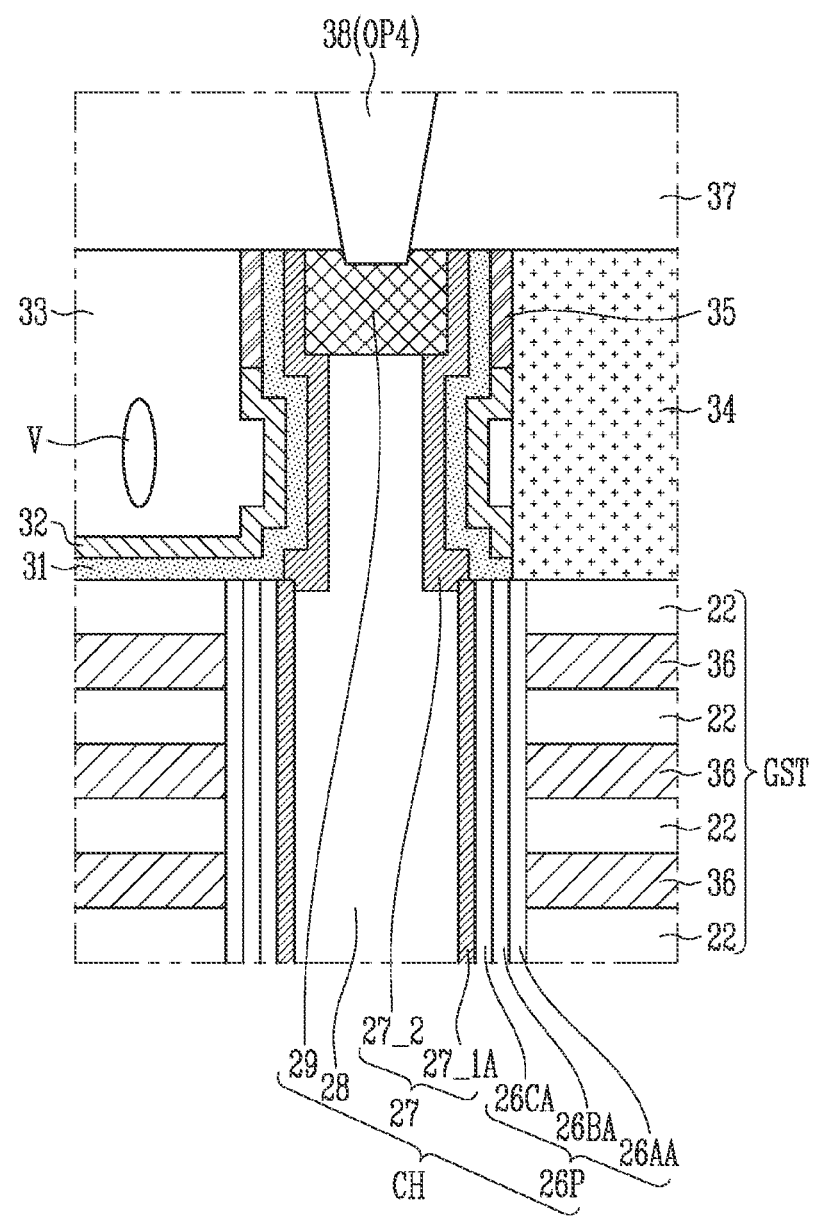

FIGS. 2A to 2N are diagrams illustrating the structure of a semiconductor device according to an embodiment of the present disclosure. Hereinafter, any repetitive detailed description of components having already been mentioned above will be omitted.

Referring to FIG. 2A, a stacked structure ST may be formed. The stacked structure ST may include first material layers 21 and second material layers 22 that are alternately stacked. The first material layers 21 may include a material with a high etch selectivity with respect to the second material layers 22. For example, the first material layers 21 may include a sacrificial material, such as a nitride, and the second material layers 22 may include an insulating material, such as an oxide. For example, the first material layers 21 may include a conductive material, such as polysilicon, tungsten, or molybdenum, and the second material layers 22 may include an insulating material, such as an oxide.

Subsequently, a sacrificial structure SC may be formed on the stacked structure ST. The sacrificial structure SC may include a first sacrificial layer 23, a second sacrificial layer 24, a third sacrificial layer 25, or a combination thereof. The first sacrificial layer 23 and the third sacrificial layer 25 may include a material with a high etch selectivity with respect to the second sacrificial layer 24. According to an embodiment, the first sacrificial layer 23 and the third sacrificial layer 25 may include a nitride, and the second sacrificial layer 24 may include an oxide. The thickness of the first sacrificial layer 23 and the thickness of the second sacrificial layer 24 may be the same as or different than the thickness of the third sacrificial layer 25.

A first opening OP1 may be formed through the stacked structure ST and the sacrificial structure SC. Subsequently, a memory layer 26 may be formed in the first opening OP1. The memory layer 26 may include a blocking layer 26A, a data storage layer 26B, a tunneling layer 26C, or a combination thereof. The data storage layer 26B may include a floating gate, a charge trapping material, polysilicon, a nitride, a variable resistance material, a phase change material, or a combination thereof. The memory layer 26 may be formed on an inner surface of the first opening OP1 and a top surface of the stacked structure ST.

Subsequently, a first channel layer 27_1 may be formed in the first opening OP1. The first channel layer 27_1 may include a semiconductor material, such as silicon (Si) or germanium (Ge), or a nanostructure. The first channel layer 27_1 may be formed along the surface of the memory layer 26. The first channel layer 27_1 may be formed in the first opening OP1 and on the stacked structure ST.

Subsequently, an insulating core layer 28A may be formed in the first openings OP1. The insulating core layer 28A may be formed in the first channel layer 27_1. Subsequently, a second opening OP2 may be formed by etching the insulating core layer 28A. The insulating core layer 28A may include an insulating material, such as an oxide, a nitride, or an air gap. The second opening OP2 may have a depth to pass through a portion of the sacrificial structure SC. The bottom surface of the second opening OP2 may be located between the top surface and the bottom surface of the sacrificial structure SC.

Referring to FIG. 2B, an insulating spacer 28B may be formed in the second opening OP2. The insulating spacer 28B may include an insulating material, such as an oxide and a nitride. The insulating spacer 28B may be formed on a top surface of the insulating core layer 28A and a surface of the first channel layer 27_1. The insulating spacer 28B, together with the insulating core layer 28A, may serve as an insulating core 28.

Referring to FIG. 2C, a channel pad 29 may be formed in the second opening OP2. According to an embodiment, after a conductive layer is formed to fill the second opening OP2, the conductive layer may be planarized until the top surface of the sacrificial structure SC is exposed. A chemical mechanical polishing (CMP) process may be used as the planarizing process. When the conductive layer is planarized, the memory layer 26, the first channel layer 27_1, and the insulating spacer 28B that are formed on the top surface of the stacked structure ST may be etched. The channel pad 29 may include a conductive material, such as polysilicon or metal. As a result, a preliminary channel structure P_CH may be formed.

Referring to FIG. 2D, the sacrificial structure SC may be removed to expose the preliminary channel structure P_CH. At least a portion of the sacrificial structure SC may be removed, and another portion of the sacrificial structure SC may remain. According to an embodiment, the third sacrificial layer 25 may be removed, and the first sacrificial layer 23 and the second sacrificial layer 24 may remain. When the third sacrificial layer 25 is removed, a portion of the memory layer 26 may also be removed. According to an embodiment, a portion of the data storage layer 26B may be etched.

Referring to FIG. 2E, a blocking pattern 26AA may be formed by etching the blocking layer 26A. When the blocking layer 26A is etched, the remaining sacrificial structure SC may be partially etched. Specifically, when the blocking layer 26A is etched, a portion of the second sacrificial layer 24 may be etched. According to an embodiment, the blocking layers 26A may be etched through a dry cleaning process. By etching the data storage layer 26B, a data storage pattern 26BA may be formed.

Referring to FIG. 2F, a tunneling pattern 26CA may be formed by etching the tunneling layer 26C. When the tunneling layer 26C is etched, the second sacrificial layer 24 may also be etched, and the first sacrificial layer 23 may be etched. As a result, a memory pattern 26P may be formed. The memory pattern 26P may include the blocking pattern 26AA, the data storage pattern 26BA, the tunneling pattern 26CA, or a combination thereof. The top surfaces of the blocking pattern 26AA, the data storage pattern 26BA, and the tunneling pattern 26CA may be located at the same level or at different levels.

A first channel pattern 27_1A may be formed by etching the first channel layer 27_1 so that a portion of the insulating core 28 may be exposed. The insulating core 28 may include a first portion 28_P1 and a second portion 28_P2 that is coupled to the first portion 28_P1. The first portion 28_P1 may pass through the stacked structure ST. The second portion 28_P2 may protrude from the top surface of the stacked structure ST. By etching the first channel layer 27_1, the second portion 28_P2 of the insulating core 28 may be exposed.

Referring to FIG. 2G, the insulating core 28 may be etched. The second portion 28_P2 of the insulating core 28 may be etched. According to an embodiment, the insulating core 28 may be etched through a wet etch process, a dry etch process, or a combination thereof. The etch process may be a cleaning process. The insulating core 28 may be patterned so that a second portion 28_P2' may have a smaller width than the first portion 28_P1'. When the insulating core 28 is etched, a portion of the memory pattern 26P may be etched. According to an embodiment, the blocking pattern 26AA and the tunneling pattern 26CA may be partially etched. The second portion 28_P2' of the insulating core 28 may have a smaller width than the channel pad 29, which may cause the formation of a recessed portion C1 in the sidewall of the preliminary channel structure P_CH.

Referring to FIG. 2H, a second channel pattern 27_2 may be formed. According to an embodiment, a second channel layer may be formed on the top surface of the stacked structure ST and the surface of the preliminary channel structure P_CH. Subsequently, the second channel pattern 27_2 may be formed by etching the second channel layer. According to an embodiment, the second channel layer may be etched through an etch-back process. When the second channel layer is etched, at least a portion of the first sacrificial layer 23 may be etched.

The second channel pattern 27_2 may cover a portion of the sidewall of the preliminary channel structure P_CH that protrudes above the top surface of the stacked structure ST. Therefore, the shape of the recessed portion C1 of the preliminary channel structure P_CH may be reflected in the shape of the second channel pattern 27_2. In other words, the second channel pattern 27_2 may include a recessed portion C2 on the sidewall thereof.

The thickness of the second channel pattern 27_2 may be substantially the same as, or different from, the thickness of the first channel pattern 27_1A. The second channel pattern 27_2 may be oxidized when the gate insulating liner is formed. Therefore, considering the amount of the second channel pattern 27_2 to be oxidized during subsequent processes, the second channel pattern 27_2 may be formed with a sufficient thickness.

The second channel pattern 27_2 may be coupled to the first channel pattern 27_1A. The second channel pattern 27_2, together with the first channel pattern 27_1A, may serve as a channel layer 27. As a result, the channel structure CH may be formed. The channel structure CH may include the channel layer 27. In addition, the channel structure CH may further include the memory pattern 26P, the insulating core 28, the channel pad 29, and the like.

Referring to FIG. 2I, a gate insulating liner 31 may be formed. The gate insulating liner 31 may be formed on the channel structure CH. According to an embodiment, the gate insulating liner 31 may cover the top surface of the stacked structure ST, the second channel pattern 27_2, and the channel pad 29. The gate insulating liner 31 may include a recessed portion C3 that is transferred from the second channel pattern 27_2.

The gate insulating liner 31 may include an insulating material, such as an oxide. The gate insulating liner 31 may be formed through a deposition method, an oxidation process, or a combination thereof. When the gate insulating liner 31 is formed through the oxidation process, the second channel pattern 27_2 and the channel pad 29 may be oxidized to a predetermined thickness, and the first sacrificial layer 23 may be oxidized. The gate insulating liner 31 may be formed after the first sacrificial layer 23 is removed.

The gate insulating liner 31 may include a single layer or multiple layers. According to an embodiment, the gate insulating liner 31 may be a single oxide layer that is formed through the oxidation process. According to an embodiment, the gate insulating liner 31 may include an oxide layer, a nitride layer, and an oxide layer in a sequential manner. For example, after an oxide layer is formed through an oxidation process and a nitride layer is deposited thereto, the oxidation process may be additionally performed thereafter, forming the gate insulating liner 31.

Referring to FIG. 2J, a gate liner 32 may be formed. The gate liner 32 may be formed on the gate insulating liner 31. The gate liner 32 may include a first portion 32_P1, a second portion 32_P2, and a third portion 32_P3. The first portion 32_P1 may surround the top surface of the stacked structure ST. The second portion 32_P2 may surround the second channel pattern 27_2. The third portion 32_P3 may surround a top surface of the channel pad 29. The gate liner 32 may include a recessed portion C4 based on the recessed portion C3 of the gate insulating liner 31. The gate liner 32 may include a conductive material, such as polysilicon, tungsten, or molybdenum.

The gate liner 32 may include a barrier layer and a metal layer. The barrier layer may include a metal nitride. The metal layer may have a single-layer or multilayer structure. For example, the metal layer, which has a multilayer structure, may include a plurality of layers that are deposited through various methods. According to an embodiment, the gate liner 32 may include a first metal layer that is deposited through Chemical Vapor deposition (CVD) and a second metal layer that is deposited through physical vapor deposition (PVD). The gate liner 32 may have a uniform thickness or a variable thickness. According to an embodiment, the third portion 32_P3 may have a greater thickness than the second portion 32_P2. According to an embodiment, the thickness of the third portion 32_P3 may be substantially the same as, or different than, the thickness of the first portion 32_P1.

Subsequently, a gap-filling insulating layer 33 may be formed on the gate liner 32. The gap-filling insulating layer 33 may include an insulating material, such as an oxide or a nitride. The gap-filling insulating layer 33 may have the void V therein. The void V may be located at a position that corresponds to the recessed portion C4 of the gate liner GL.

Referring to FIG. 2K, a trench T that passes through the gap-filling insulating layer 33 may be formed. The trench T may pass through the first portion 32_P1 of the gate liner 32. The trench T may expose the second portion 32_P2 and the third portion 32_P3 of the gate liner 32. According to an embodiment, after a mask pattern 39 is formed on the gap-filling insulating layer 33, the gap-filling insulating layer 33 may be etched by using the mask pattern 39 as an etch barrier to expose the gate liner 32. Subsequently, the gate liner 32 may be etched by using the mask pattern 39 as an etch barrier. The first portion 32_P1 of the gate liner 32 may be etched, and the second portion 32_P2 may remain. The exposed portion of the third portion 32_P3 of the gate liner 32 may be etched based on the mask pattern 39. The third portion 32_P3 may be etched to a predetermined thickness or to a depth that exposes the gate insulating liner 31. At least a portion of the gate insulating liner 31 that is exposed by etching the gate liner 32 may be etched. The top surface of the stacked structure ST may be exposed by etching the gate insulating liner 31.

A first portion sidewall 32_P1SW and a second portion sidewall 32_P2SW of the gate liner 32 may be defined by the trench T. In addition, the second portion sidewall 32_P2SW may protrude from the first portion sidewall 32_P1SW.

Referring to FIG. 2L, an isolation insulating layer 34 may be formed in the trench T. After an insulating layer is formed to fill the trench T, the insulating layer may be planarized until the top surface of the channel pad 29 is exposed, thereby forming the isolation insulating layer 34. During the planarization process, the gate insulating liner 31, the gate liner 32, and the gap-filling insulating layer 33 that are formed on the channel pad 29 may be etched. The isolation insulating layer 34 may pass through the gap-filling insulating layer 33 and the first portion 32_P1 of the gate liner 32. The isolation insulating layer 34 may include an insulating material, such as an oxide or a nitride.

Subsequently, the second channel pattern 27_2 may be doped with impurities. According to an embodiment, by using an impurity implantation process, impurities may be implanted into the second channel pattern 27_2. As a result, a threshold voltage of a select transistor may be controlled.

Referring to FIG. 2M, a third opening OP3 may be formed by etching the gate liner 32. The third opening OP3 may be located between the gate insulating liner 31 and the gap-filling insulating layer 33. The gap-filling insulating layer 33 and the gate insulating liner 31 may be exposed through the third opening OP3. The third opening OP3 may also be located between the gate insulating line 31 and the isolation insulating layer 34. The gate insulating liner 31 and the isolation insulating layer 34 may be exposed through the third opening OP3.

Subsequently, a barrier pattern 35 may be formed in the third opening OP3. The barrier pattern 35 may be coupled to the gate liner 32. The barrier pattern 35 may surround the gate insulating liner 31. The barrier pattern 35 may serve as an etch stop layer during subsequent processes and may include a nitride.

Referring to FIG. 2N, the first material layers 21 may be replaced by third material layers 36. According to an embodiment, after a slit that passes through the stacked structure ST is formed, the first material layers 21 may be replaced by the third material layers 36 through the slit. The third material layers 36 may include a conductive material, such as doped polysilicon, tungsten, molybdenum, or metal. As a result, the gate stack GST in which the second material layers 22 and the third material layers 36 are stacked alternately with each other may be formed. For example, when the first material layers 21 include a sacrificial material and the second material layers 22 include an insulating material, conductive layers may be formed after the first material layers 21 are removed. In another example, when the first material layers 21 include a conductive material and the second material layers 22 include an insulating material, the first material layers 21 may be silicided to form metal silicide layers.

After an interlayer insulating layer 37 is formed, a fourth opening OP4 may be formed. The fourth opening OP4 may be formed by etching the interlayer insulating layer 37. The fourth opening OP4 may pass through the interlayer insulating layer 37 and may expose the channel pad 29. Even when the barrier pattern 35 is exposed during the process of etching the interlayer insulating layer 37 due to mask misalignment, the barrier pattern 35 may be used as an etch stop layer and may protect the gate liner 32. A contact plug 38 may be formed in the fourth opening OP4.

According to the above-described manufacturing method, the gate liner 32 with an L-shaped cross-section may be formed on a sidewall of the second channel pattern 27_2. In addition, the gate liner 32 may surround the entire sidewall of the second channel pattern 27_2 so that select transistors with uniform characteristics may be formed.

Figure 3:
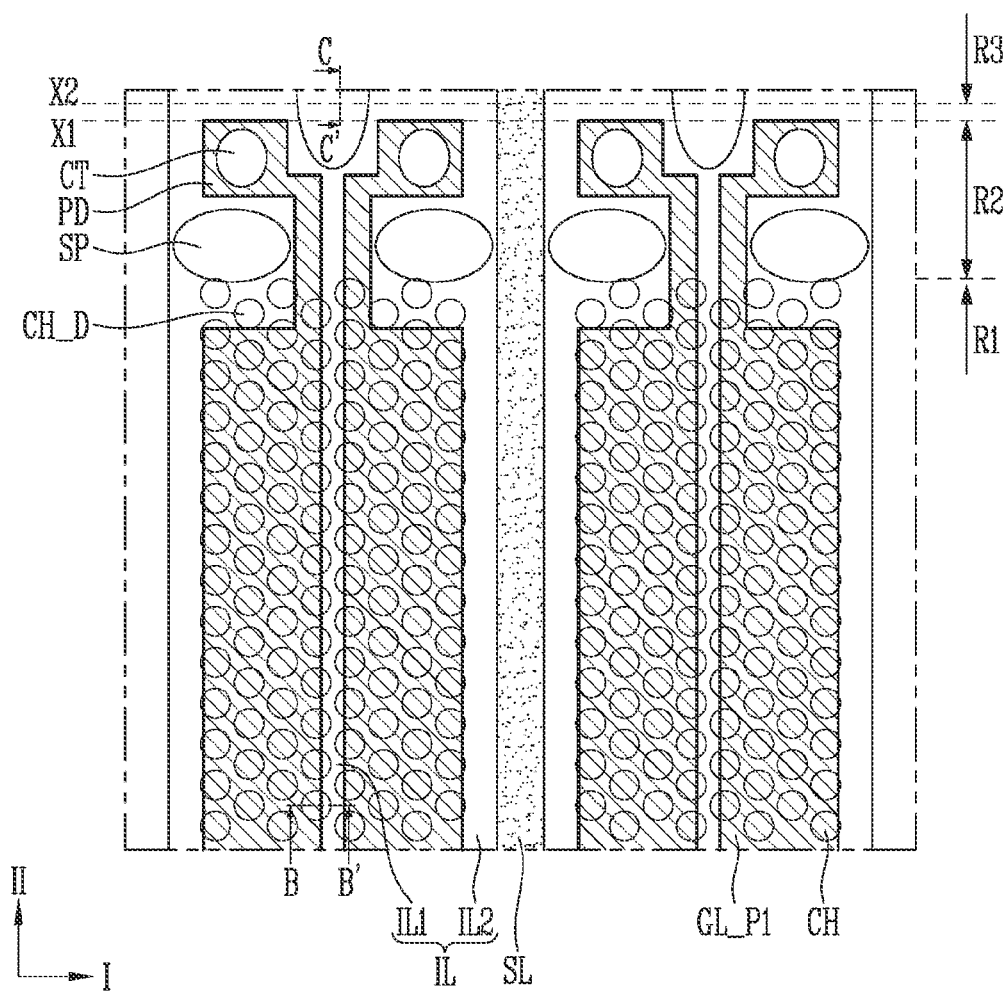
FIG. 3 is a layout view illustrating a semiconductor device according to an embodiment of the present disclosure.

FIG. 3 is a layout view illustrating a semiconductor device according to an embodiment of the present disclosure. Hereinafter, any repetitive detailed description of components having already been mentioned above will be omitted.

Referring to FIG. 3, a semiconductor device may include a first region R1, a second region R2, and a third region R3. The first region R1 and the third region R3 may be adjacent to each other in the second direction II, and the second region R2 may be located between the first region R1 and the third region R3. The second region R2 and the third region R3 may contact each other. However, a first edge X1 of the second region R2 and a second edge X2 of the third region R3 may be separated from each other by a predetermined distance.

Memory cells may be located in the first region R1. According to an embodiment, memory strings may be located in the first region R1. Each of the memory strings may include at least one source select transistor, a plurality of memory cells, and at least one drain select transistor. The second region R2 may refer to a region where a pad PD of the gate liner GL is located. According to an embodiment, a pad of a drain select line may be located in the second region R2. Pads of word lines may be located in the third region R3. According to another embodiment, the pads of the word lines and the drain select line may be located in the third region R3.

The gate liner GL may be located in the first region R1 and the second region R2. In the plane that is defined in the first direction I and the second direction II, the first portion GL_P1 of the gate liner GL may extend in the second direction II. In a plan view, the first portion GL_P1 may have a width in the first direction I and a length in the second direction II. The first portion GL_P1 may have a uniform width or a varying width. The end of the first portion GL_P1 may serve as the pad PD. A contact plug CT may be electrically coupled to the pad PD.

The isolation insulating layers IL may be located in the first region R1 and the second region R2 and may extend to the third region R3. In the plane that is defined in the first direction I and the second direction II, the isolation insulating layers IL may extend in the second direction II. In the plane view, each of the isolation insulating layers IL may have a width in the first direction I and a length in the second direction II. The isolation insulating layers IL may have substantially the same width or may have different widths from each other. According to an embodiment, a second isolation insulating layer IL2 may have a greater width than a first isolation insulating layer IL1. A slit structure SL may be formed in the second isolation insulating layer IL2. The slit structure SL may include an insulating material, a source contact structure, or a combination thereof.

Each of the isolation insulating layers IL may have a uniform width or a varying width. A support body SP may be formed at a portion with a relatively large width within the isolation insulating layer IL. The support body SP may pass through the isolation insulating layer IL and the stacked structure ST or may pass through the isolation insulating layer IL and the gate stack GST. The support body SP may include an insulating material, a semiconductor material, a conductive material, or a combination thereof.

The channel structures CH may be located in the first region R1. Some of the channel structures CH may be dummy channel structures CH_D. According to an embodiment, a channel structure that is located adjacent to the second region R2, among the channel structures CH, may be the dummy channel structure CH_D. The dummy channel structure CH_D may overlap the isolation insulating layer IL.

FIGS. 4A, 5A, 6A, 7A, and 8A, FIGS. 4B, 5B, 6B, 7B, and 8B, and FIG. 8C are diagrams illustrating a method of manufacturing a semiconductor device according to an embodiment of the present disclosure. FIGS. 4A, 5A, 6A, 7A, and 8A may correspond to B-B' cross-sections of FIG. 3. FIGS. 4B, 5B, 6B, 7B, and 8B may correspond to C-C' cross-sections of FIG. 3. Hereinafter, any repetitive detailed description of components having already been mentioned above will be omitted.

Figure 4A:
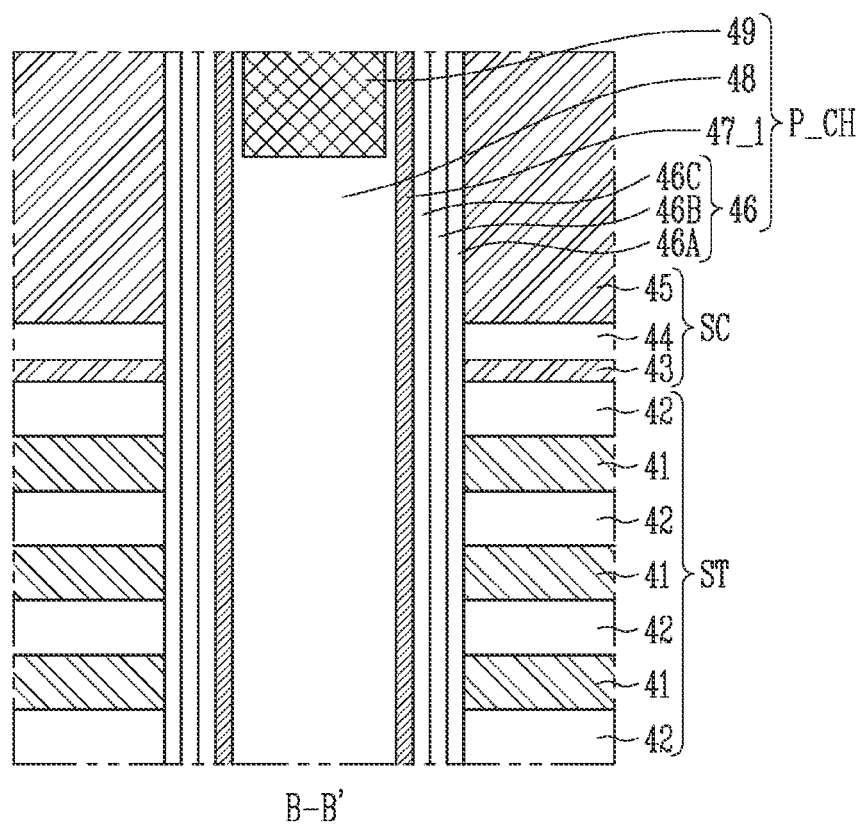
FIGS. 4A, 5A, 6A, 7A, and 8A, FIGS. 4B, 5B, 6B, 7B, and 8B, and FIG. 8C are diagrams illustrating a method of manufacturing a semiconductor device according to an embodiment of the present disclosure.
Figure 4B:
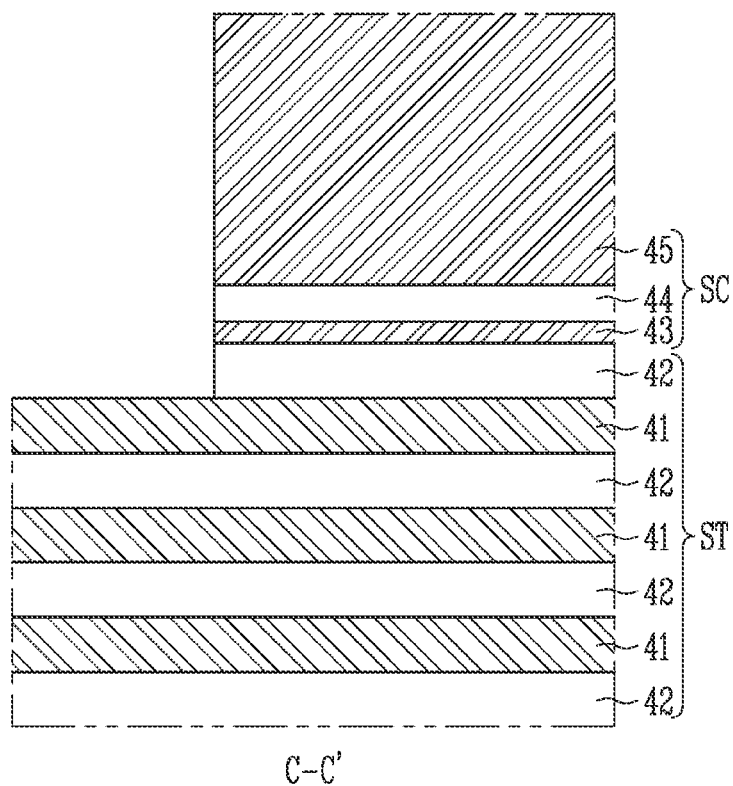

Referring to FIGS. 4A and 4B, the stacked structure ST may be formed. The stacked structure ST may include first material layers 41 and second material layers 42 that are alternately stacked on top of one another. Subsequently, the sacrificial structure SC may be formed on the stacked structure ST. The sacrificial structure SC may include a first sacrificial layer 43, a second sacrificial layer 44, a third sacrificial layer 45, or a combination thereof.

Subsequently, the preliminary channel structure P_CH may be formed. The preliminary channel structure P_CH may include a first channel layer 47_1. The preliminary channel structure P_CH may further include a memory layer 46, an insulating core 48, a channel pad 49, or a combination thereof. The memory layer 46 may include a blocking layer 46A, a data storage layer 46B, a tunneling layer 46C, or a combination thereof.

Subsequently, after a first mask pattern (not shown) is formed on the sacrificial structure SC, the stacked structure ST may be etched by using the first mask pattern as an etch barrier. Referring to FIG. 3, the first mask pattern may cover the first region R1 and the second region R2 and may expose the third region R3. The first mask pattern may be aligned with the second edge X2 of the third region R3. Subsequently, the first mask pattern may be removed.

Subsequently, the third region R3 may be patterned in a stepwise manner. According to an embodiment, a mask pattern that exposes a portion on which a pad is formed may be formed on the stacked structure ST. Subsequently, an etch process that uses a mask pattern as an etch barrier and a process of reducing the mask pattern may be performed alternately. As a result, each of the first material layers 41 may be exposed. The exposed portion of each of the first material layers 41 may be defined as a pad.

Figure 5A:
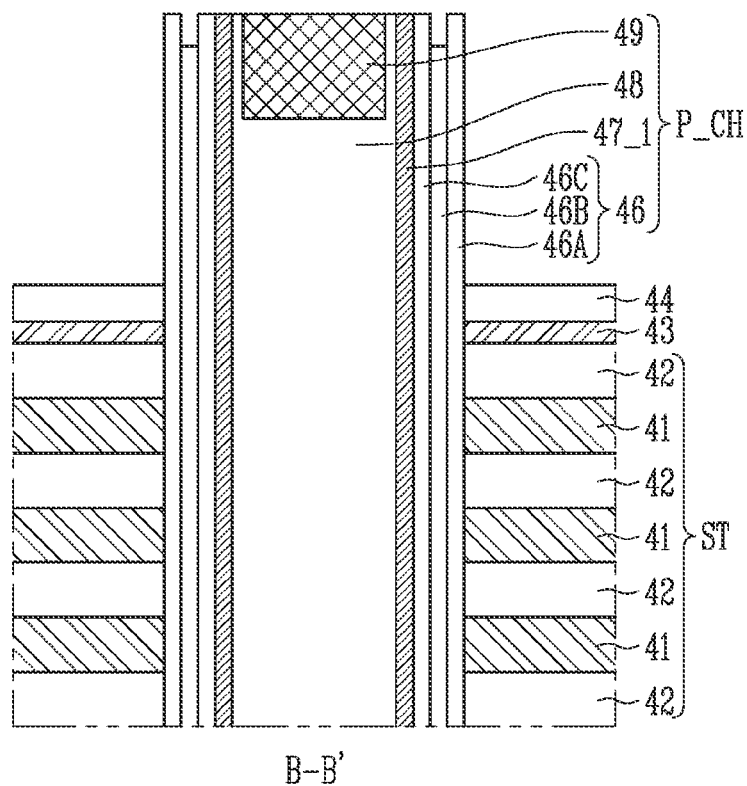
Figure 5B:
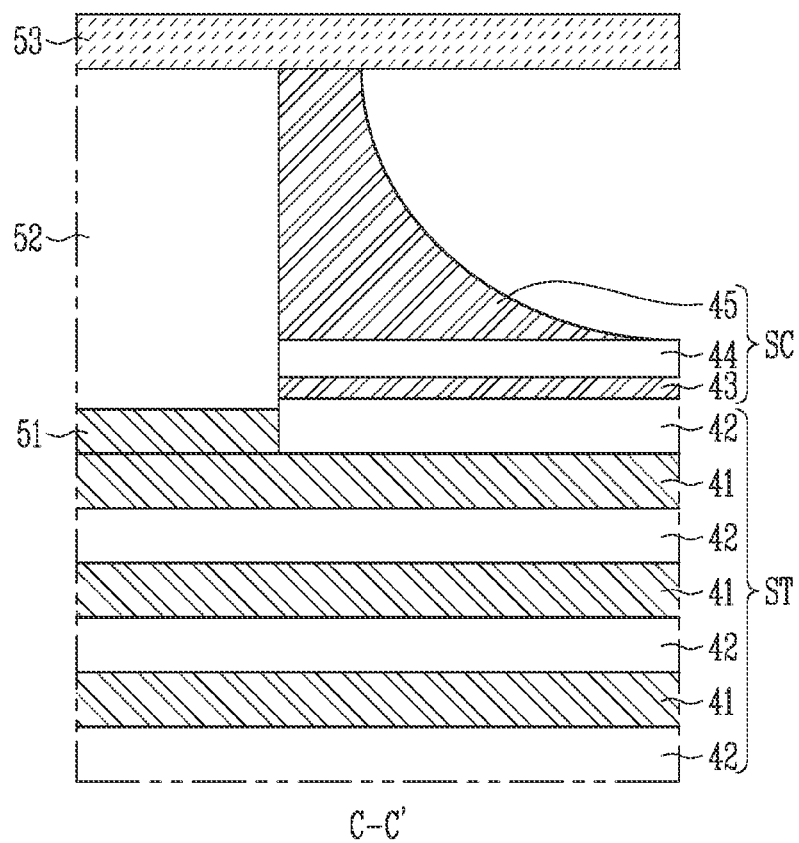

Referring to FIGS. 5A and 5B, first material patterns 51 may be formed on the first material layers 41, respectively. As a result, the thickness of the pad of each of the first material layers 41 may be increased. Subsequently, an interlayer insulating layer 52 may be formed.

Subsequently, after a second mask pattern 53 is formed, the third sacrificial layer 45 may be etched by using the second mask pattern 53 as an etch barrier. Referring to FIG. 3, the second mask pattern 53 may cover the third region R3 and may expose the first region R1 and the second region R2. The second mask pattern 53 may be aligned with the first edge X1. As a result, in the first region R1, the third sacrificial layer 45 may be etched and the second sacrificial layer 44 may be exposed. The third sacrificial layer 45 may be etched between the first edge X1 and the second edge X2, and the third sacrificial layer 45 may be patterned to have an inclined sidewall. According to an embodiment, the sidewall of the third sacrificial layer 45 may have a concaved shape.

Figure 6A:
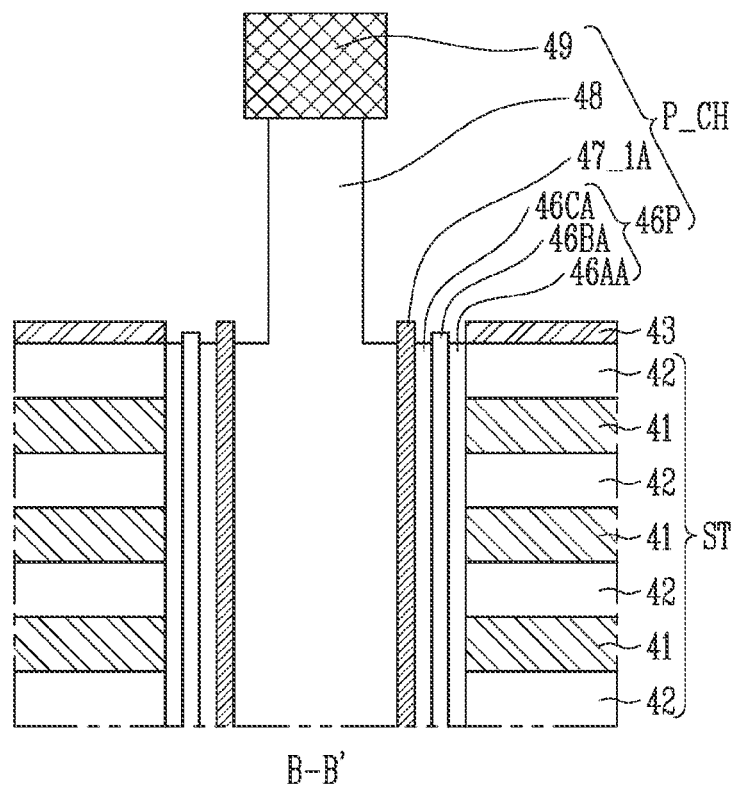
Figure 6B:
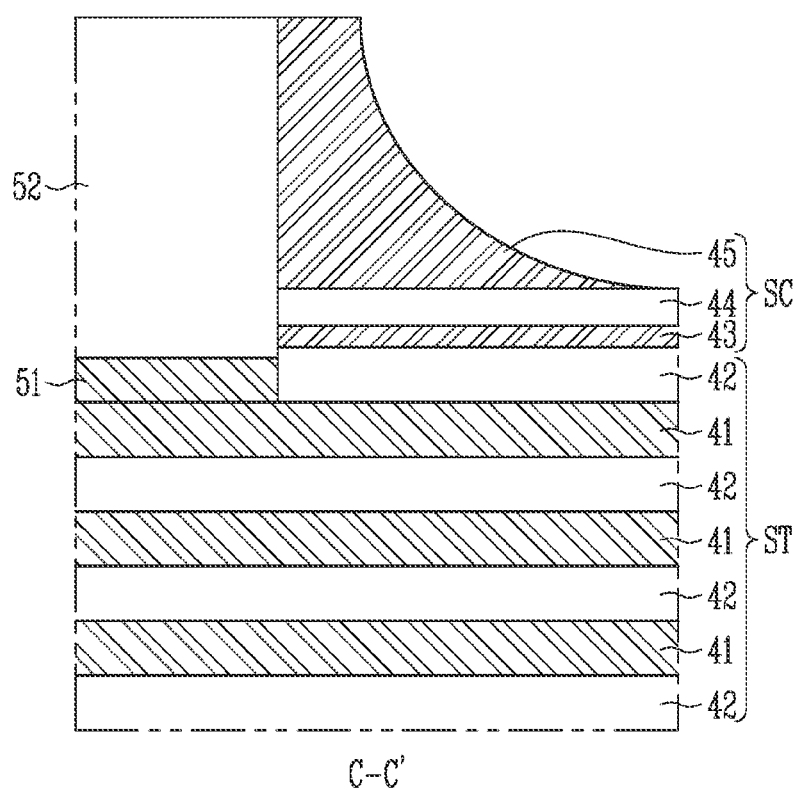

Referring to FIGS. 6A and 6B, the memory layer 46 may be etched to form a memory pattern 46P. The memory pattern 46P may include a blocking pattern 46AA, a data storage pattern 46BA, a tunneling pattern 46CA, or a combination thereof. A first channel pattern 47_1A may be formed by etching the first channel layer 47_1. Subsequently, the insulating core 48 may be etched. In this process, in the first region R1, the second sacrificial layer 44 may be etched and the first sacrificial layer 43 may be exposed.

Figure 7A:
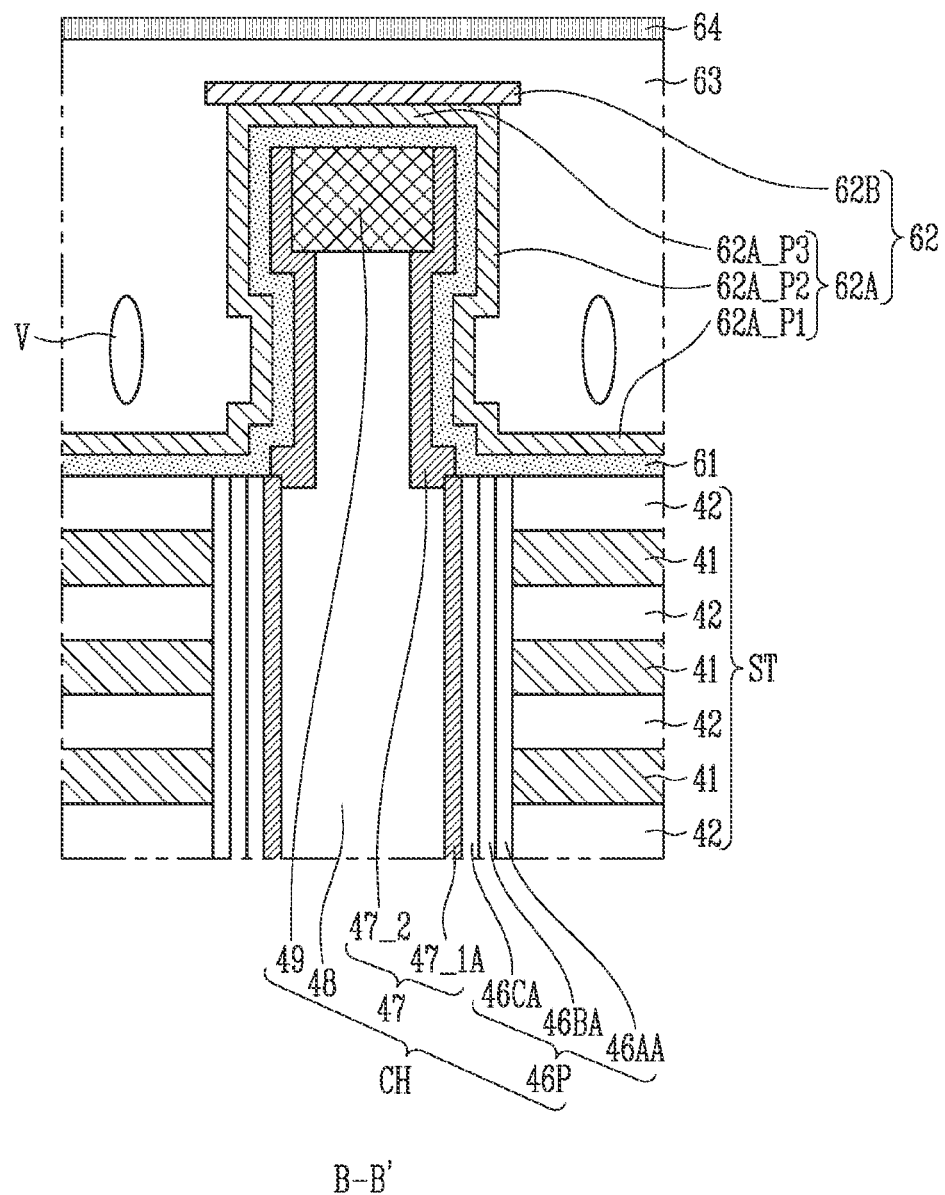
Figure 7B:
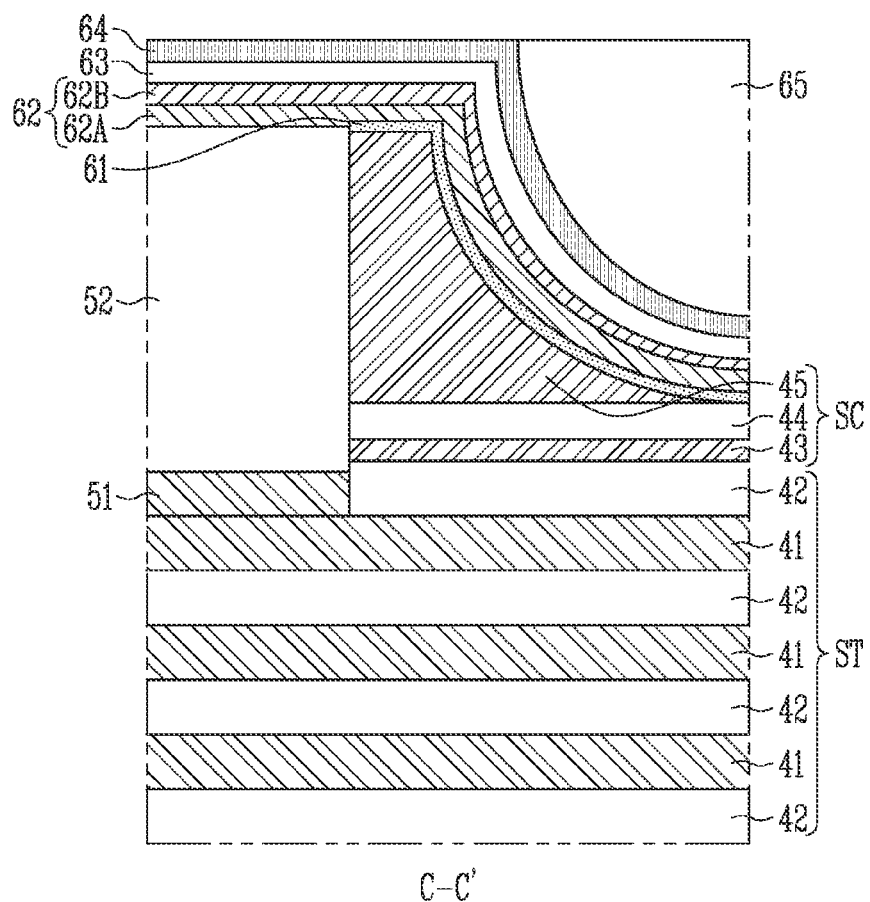

Referring to FIGS. 7A and 7B, a second channel pattern 47_2, a gate insulating liner 61, and a gate liner 62 may be formed. The gate liner 62 may include a first gate liner 62A and a second gate liner 62B. The first gate liner 62A may be formed on the gate insulating liner 61. The first gate liner 62A may include a first portion 62A_P1, a second portion 62A_P2, and a third portion 62A_P3. The first gate liner 62A may have a uniform thickness or a varying thickness. The second gate liner 62B may be formed on the first gate liner 62A. The second gate liner 62B may have a uniform thickness or a varying thickness.

The first gate liner 62B and the second gate liner 62B may be formed through the same manner or through different manners. According to an embodiment, the first gate liner 62A may be a tungsten layer that is deposited through a CVD method and may have a substantially uniform thickness. The second gate liner 62A may be a tungsten layer that is deposited through a PVD method and may have a partially different thickness.

When the second gate liner 62B is formed through the PVD method, a gate liner material may be primarily deposited onto the third portion 62A_P3 of the first gate liner 62A. The gate liner material may be deposited on the second portion 62A_P2 so as to have a smaller thickness than the gate liner material on the third portion 62A_P3. The gate liner material may also be deposited on the first portion 62A_P1 with the gate liner material. The gate liner material may be deposited on the first portion 62A_P1 so as to have substantially the same thickness as the gate liner material on the third portion 62A_P3 or to have a smaller thickness than the gate liner material on the third portion 62A_P3.

When the second gate liner 62B is formed through the PVD method, referring to FIG. 3, the gate liner material may be deposited to a relatively small thickness between the channel structures CH. The first portion GL_P1 of the gate liner GL may include an edge that extends in the second direction II, and the gate liner material may be deposited onto the edge at a greater thickness than at another area. In addition, the gate liner 62 may include the pad PD that is electrically coupled to the contact plug CT. The pad PD may be deposited with the gate liner material at a relatively great thickness. Therefore, it may be possible to ensure an etching margin when a contact hole is formed to form the contact plug CT. Etch selectivity may be ensured by using the second gate liner 62B that is formed through the PVD method as an etch stop layer when the contact hole is formed.

Subsequently, a gap-filling insulating layer 63 may be formed on the gate liner 62. After a protective layer 64 is formed, an interlayer insulating layer 65 may be formed. According to an embodiment, after an insulating material is formed on the protective layer 64, the insulating material may be planarized to form the interlayer insulating layer 65. When the insulating material is planarized, the protective layer 64 may be used as a planarization stop layer. According to an embodiment, the protective layer 64 may include a nitride.

The gate insulating liner 61, the gate liner 62, the gap-filling insulating layer 63, and the protective layer 64 may be formed along the concaved sidewall of the third sacrificial layer 45, between the first edge X1 and the second edge X2.

Figure 8A:
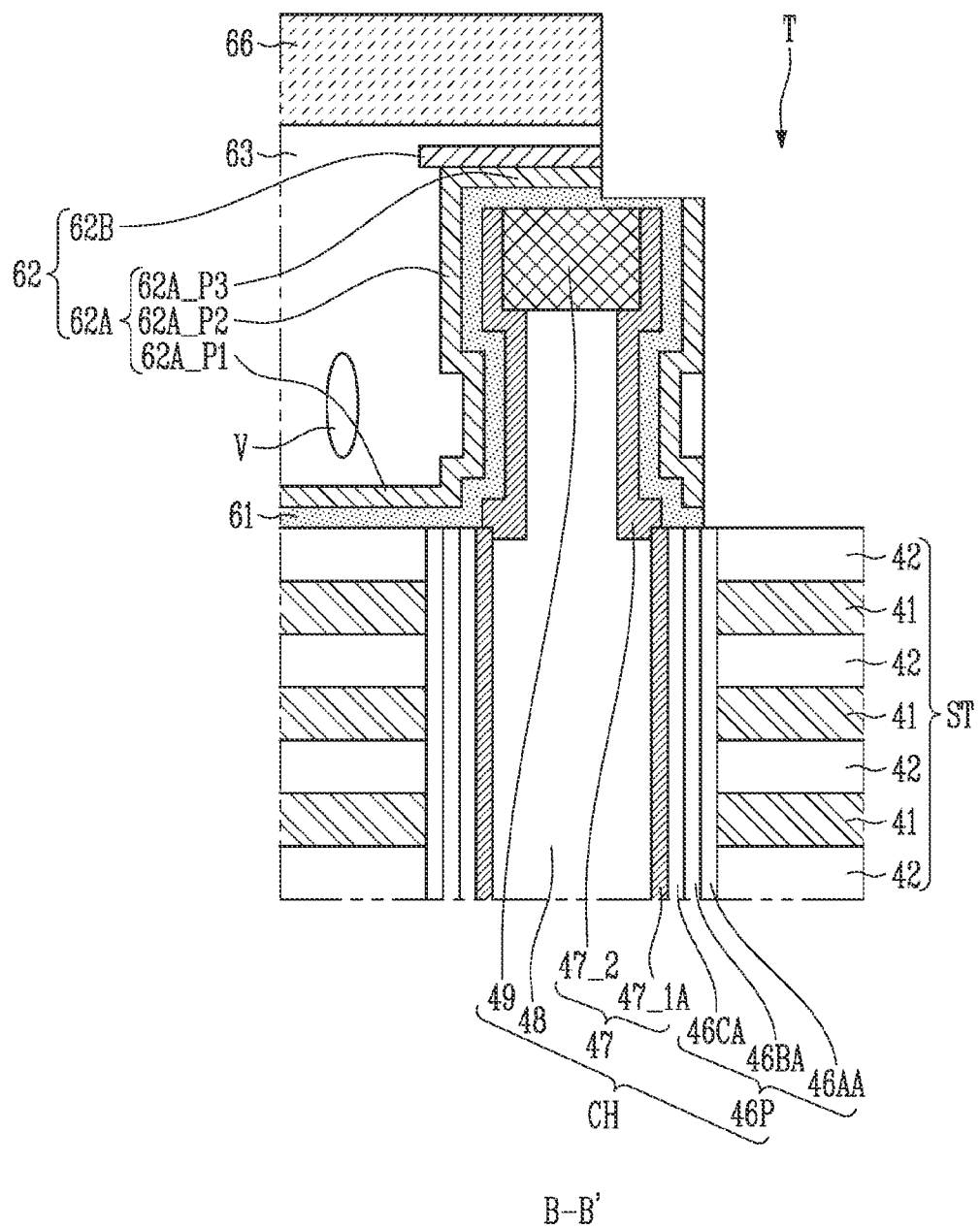
Figure 8B:
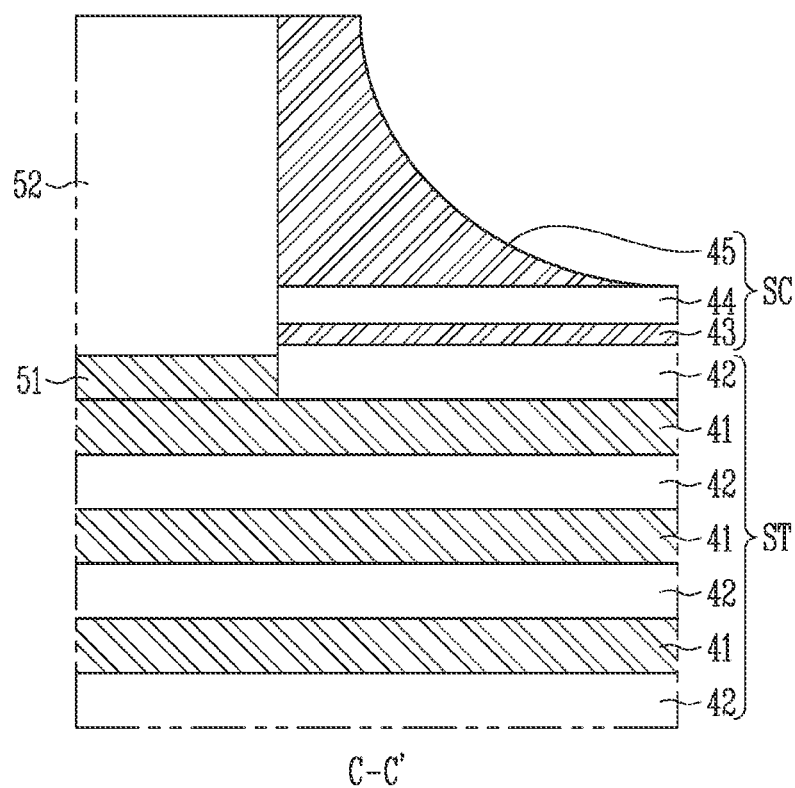
Figure 8C:
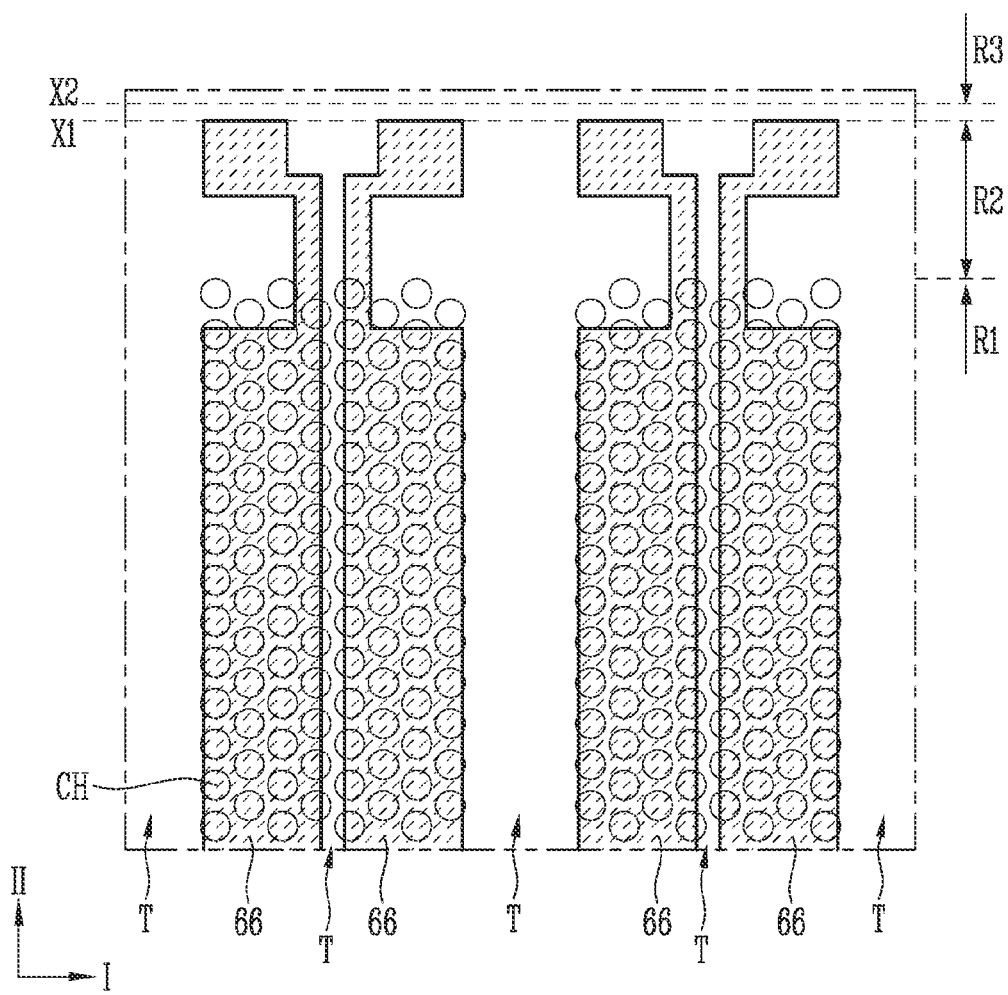

Referring to FIGS. 8A to 8C, a third mask pattern 66 may be formed. The third mask pattern 66 may be provided to pattern the gate liner 62. The trench T may be formed by etching the gap-filling insulating layer 63 and the gate liner 62 by using the third mask pattern 66 as an etch barrier. Since the gate liner 62 has a relatively large thickness on the top surface of the channel structure CH, the gate liner 62 may prevent the channel structure CH from being exposed or damaged when the trench T is formed. Since the second gate liner 62B protrudes farther than the second portion 62A_P2 of the first gate liner 62A, the second gate liner 62B may prevent the second portion 62A_P2 from being etched when the trench T is formed.

At least portions of the interlayer insulating layer 65, the protective layer 64, the gap-filling insulating layer 63, the gate liner 62, and the gate insulating liner 61 may be etched between the first edge X1 and the second edge X2. The gate liner 62 may be etched, and due to the concaved sidewall of the third sacrificial layer 45, less residue may accumulate as opposed to a situation in which the third sacrificial layer 45 has a vertical sidewall. Therefore, it may be possible to prevent a bridge from being caused by the gate liner material that remains on the sidewall of the third sacrificial layer 45.

In addition, though not shown in FIGS. 8A to 8C, an isolation insulating layer may be formed, and the first material layers 41 and the first material patterns 51 may be replaced by third material layers. The third sacrificial layer 45 may be replaced by a fourth material layer between the first edge X1 and the second edge X2. The fourth material layer may include an insulating material. A planarizing process may be performed to expose the channel pad 49, and a contact plug that is coupled to the channel pad 49 may be formed. In addition, a contact plug that is coupled to the pad of the gate liner 62 may be formed.

According to the above-described manufacturing method, by forming the first gate liner 62A and the second gate liner 62B through different deposition methods, the gate liner 62 may be formed with a variable thickness. Therefore, when the trench T is formed, the channel structure CH or the second portion 62A_P2 may be protected. In addition, when the contact plug that is coupled to the pad of the gate liner 62 is formed, an etching margin may be ensured.

FIG. 9 is a diagram illustrating a memory system 1000 according to an embodiment of the present disclosure.

Referring to FIG. 9, the memory system 1000 may include a memory device 1200 configured to store data and a controller 1100 configured to perform communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among, for example, Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control the overall operations of the memory system 1000. The controller 1100 may control the memory device 1200 in response to the requests of the host 2000. The controller 1100 may control the memory device 1200 to perform a program operation, a read operation, and an erase operation at the request of the host 2000. Alternatively, the controller 1100 may perform a background operation to improve the performance of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods in which the data signal is input.

The memory device 1200 may perform a program operation, a read operation and an erase operation in response to control of the controller 1100. The memory device 1200 may be a volatile memory that loses data when a power supply is blocked or a non-volatile memory that retains data in the absence of power supply. The memory device 1200 may have the structure as described above with reference to FIGS. 1A to 1E. In addition, the memory device 1200 may be a semiconductor device that is manufactured through the method as described above with reference to FIGS. 2A to 8C. According to an embodiment, the semiconductor device may include a gate stack that includes conductive layers and insulating layers stacked alternately with each other, channel layers that pass through the gate stack and protrude above a top surface of the gate stack, a gate liner that includes a first portion surrounding the top surface of the gate stack and second portions protruding from the first portion and surrounding the channel layers; and an isolation insulating layer that is stacked on the gate stack and passes through the first portion of the gate liner, in which at least one of the second portions may protrude farther into the isolation insulating layer than the first portion.

Figure 10:
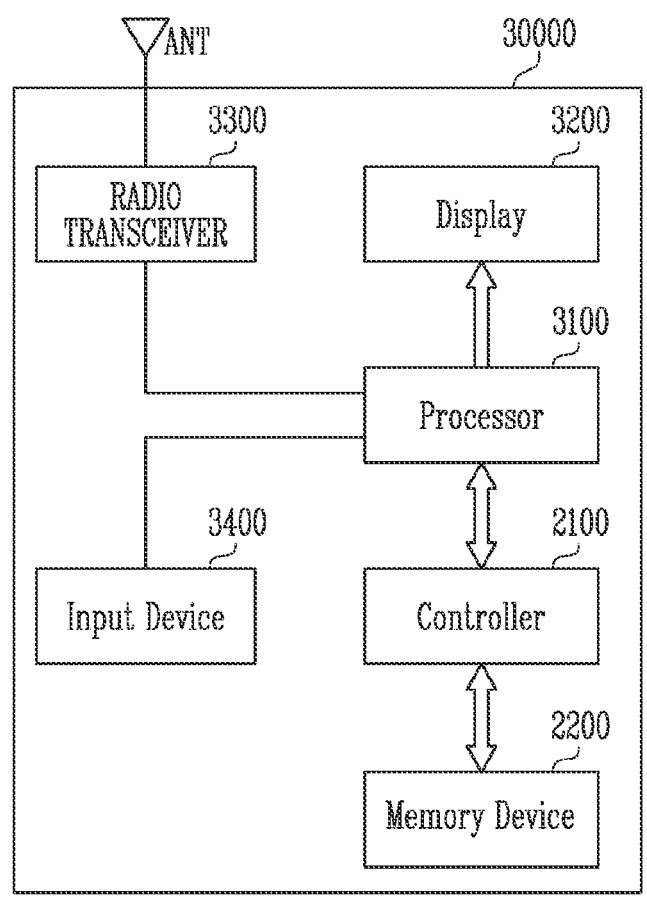
FIG. 10 is a diagram illustrating a memory system according to an embodiment of the present disclosure.

FIG. 10 is a diagram illustrating a memory system 30000 according to an embodiment of the present disclosure.

Referring to FIG. 10, the memory system 30000 may be incorporated into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal which may be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 11:
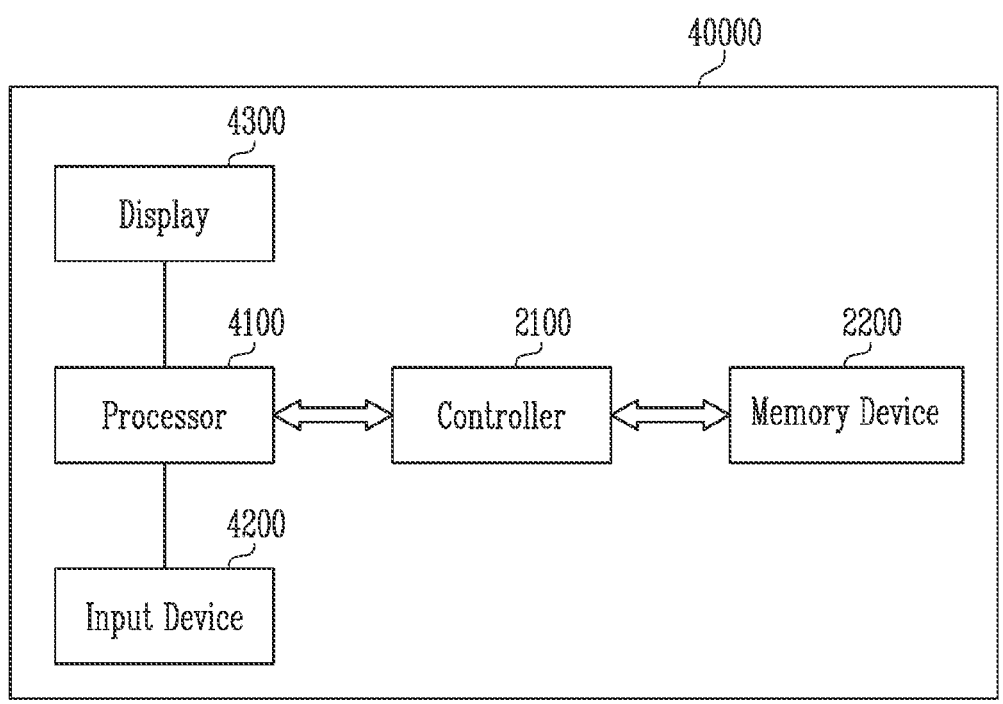
FIG. 11 is a diagram illustrating a memory system according to an embodiment of the present disclosure.

FIG. 11 is a diagram illustrating a memory system 40000 according to an embodiment of the present disclosure.

Referring to FIG. 11, the memory system 40000 may be incorporated into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 that controls a data processing operation of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 12:
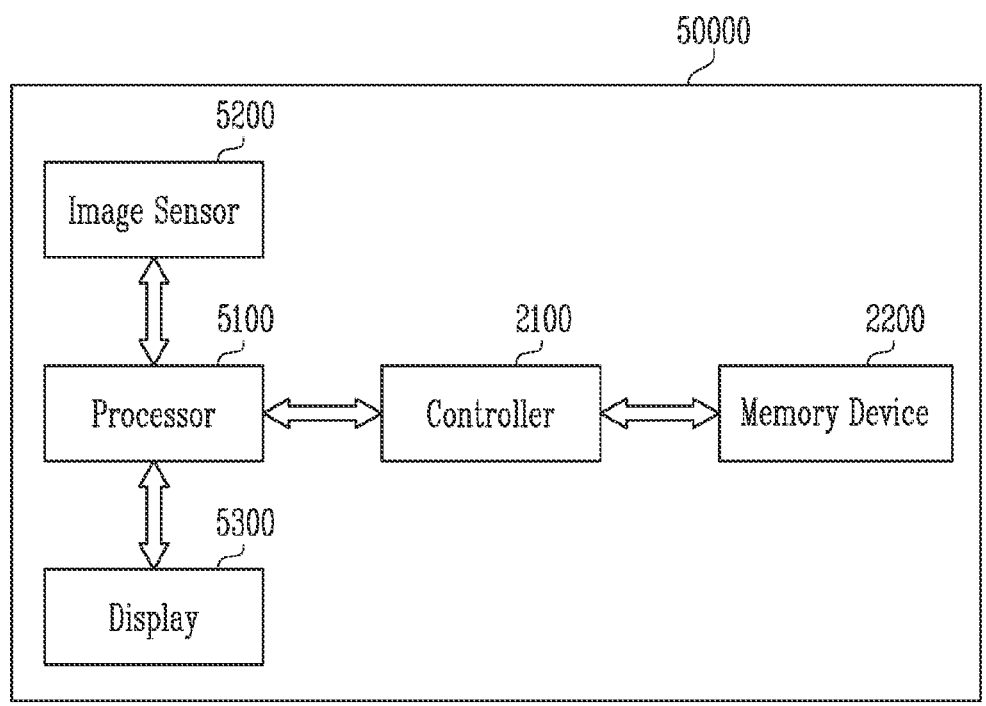
FIG. 12 is a diagram illustrating a memory system according to an embodiment of the present disclosure.

FIG. 12 is a block diagram illustrating a memory system 50000 according to an embodiment of the present disclosure.

Referring to FIG. 12, the memory system 50000 may be incorporated into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 that controls a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 that is capable of controlling the operations of the memory device 2200 may be formed as a part of the processor 5100, or a separate chip from the processor 5100.

Figure 13:
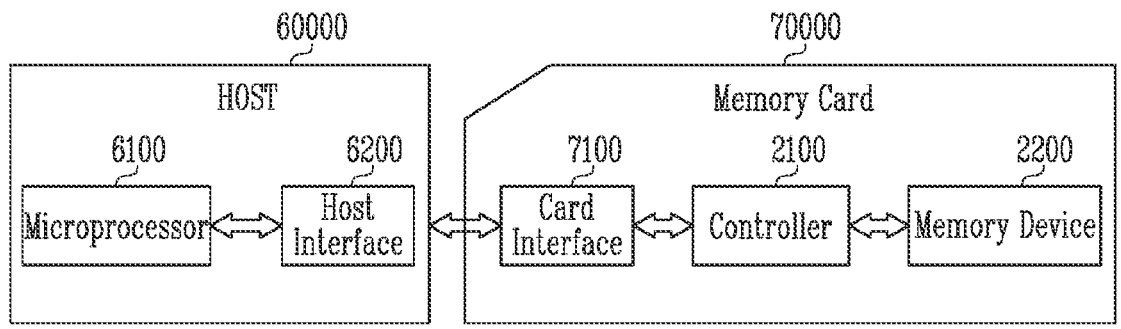
FIG. 13 is a diagram illustrating a memory system according to an embodiment of the present disclosure.

FIG. 13 is a diagram illustrating a memory system 70000 according to an embodiment of the present disclosure.

Referring to FIG. 13, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

According to the present disclosure, by three-dimensionally stacking memory cells, the density of integration of a semiconductor device may be improved. In addition, a semiconductor device with a stabilized structure and improved reliability may be provided.

What is claimed is:

1. A method of manufacturing a semiconductor device, the method comprising:

forming a stacked structure with first material layers and second material layers that are stacked alternately with each other;

forming a preliminary channel structure with a first channel pattern that passes through the stacked structure and an insulating core with a first portion that is located in the first channel pattern and a second portion that is coupled to the first portion, the second portion protruding above a top surface of the stacked structure;

forming a channel structure that surrounds the insulating core, the channel structure including a second channel pattern that is coupled to the first channel pattern;

etching a portion of a side of the channel structure, wherein a width of a middle portion of the channel structure is narrower than a width of a lower portion of the channel structure;

forming a gate liner with a first portion that covers the top surface of the stacked structure and a second portion that surrounds the second channel pattern;

forming a gap-filling insulating layer on the gate liner; and forming an isolation insulating layer that passes through the gap-filling insulating layer and the first portion of the gate liner, wherein the second portion of the gate liner includes a lower portion continuously connected to the first portion of the gate liner, a middle portion connected to the lower portion and an upper portion connected to the middle portion, a width of the lower portion of the second portion of the gate liner and the upper portion of the second portion of the gate liner is wider than a width of the middle portion of the second portion of the gate liner.

2. The method of claim 1, wherein the forming of the preliminary channel structure comprises:

forming a sacrificial structure on the stacked structure;

forming a first opening that passes through the sacrificial structure and the stacked structure;

forming a first channel layer in the first opening;

forming the insulating core in the first channel layer;

removing the sacrificial structure to expose the preliminary channel structure; and forming the first channel pattern by etching the first channel layer.

3. The method of claim 2, wherein the forming of the insulating core comprises:

forming an insulating core layer in the first channel layer;

forming a second opening by etching a portion of the insulating core layer;

forming an insulating spacer in the second opening; and forming a channel pad in the insulating spacer.

4. The method of claim 1, further comprising etching the second portion of the insulating core so that the second portion of the insulating core has a smaller width than the first portion of the insulating core.

5. The method of claim 1, further comprising forming a gate insulating liner that surrounds the top surface of the stacked structure and the second channel pattern before the forming of the gate liner.

6. The method of claim 1, wherein the forming of the isolation insulating layer comprises:
   forming a trench that passes through the first portion of the gate liner, the trench exposing the second portion of the gate liner; and
   forming the isolation insulating layer in the trench.

7. The method of claim 1, further comprising:
   forming a third opening between the second channel pattern and the gap-filling insulating layer by etching the gate liner; and
   forming a barrier pattern in the third opening.

8. The method of claim 1, further comprising replacing the first material layers with third material layers after the forming of the isolation insulating layer.

9. A method of manufacturing a semiconductor device, the method comprising:
   forming a stacked structure with first material layers and second material layers that are stacked alternately with each other;
   forming a preliminary channel structure with a first channel pattern that passes through the stacked structure and an insulating core and a channel pad, the insulating core with a first portion that is located in the first channel pattern and a second portion that is coupled to the first portion, the second portion protruding above a top surface of the stacked structure, the channel pad located in the second portion of the insulating core;
   forming a first recessed portion between the channel pad and the first portion of the insulating core by etching a sidewall of the second portion of the insulating core;
   forming a second channel pattern with a second recessed portion corresponding to the first recessed portion, the second channel pattern coupled to the first channel pattern;
   forming a gate insulating liner with a third recessed portion corresponding to the second recessed portion, the gate insulating liner extending the top surface of the stacked structure and a sidewall of the second channel pattern; and
   forming a gate conductive liner with a fourth recessed portion corresponding to the third recessed portion, the gate conductive liner covering a surface of the gate insulating liner.

* * * * *